United States Patent
Takamine

(10) Patent No.: US 6,771,144 B2
(45) Date of Patent: Aug. 3, 2004

(54) SURFACE ACOUSTIC WAVE FILTER WITH A THREEFOLD MODE FILTER SECTION AND A RESONATOR

(75) Inventor: Yuichi Takamine, Kanazawa (JP)

(73) Assignee: Murata Manufacturing Co., Ltd., Kyoto (JP)

(*) Notice: Subject to any disclaimer, the term of this patent is extended or adjusted under 35 U.S.C. 154(b) by 9 days.

(21) Appl. No.: 10/376,675

(22) Filed: Feb. 27, 2003

(65) Prior Publication Data

US 2003/0164745 A1 Sep. 4, 2003

(30) Foreign Application Priority Data

Feb. 28, 2002 (JP) ........................................ 2002-054781
Sep. 30, 2002 (JP) ........................................ 2002-286320

(51) Int. Cl.[7] .............................. H03H 9/64; H03H 9/72
(52) U.S. Cl. ........................ 333/133; 333/193; 333/195; 310/313 B; 310/313 D
(58) Field of Search .............................. 333/193–196, 333/133; 310/313 B, 313 D

(56) References Cited

U.S. PATENT DOCUMENTS

| | | | | |
|---|---|---|---|---|
| 5,392,013 A | * | 2/1995 | Yamamoto et al. | 333/195 |
| 5,877,661 A | * | 3/1999 | Ohmura et al. | 333/193 |
| 5,936,483 A | * | 8/1999 | Ikada | 333/133 |
| 6,369,674 B1 | * | 4/2002 | Matsumoto et al. | 333/195 |
| 6,462,632 B1 | * | 10/2002 | Fujii et al. | 333/193 |
| 6,556,100 B2 | * | 4/2003 | Takamine | 333/133 |
| 6,606,016 B2 | * | 8/2003 | Takamine | 333/133 |

FOREIGN PATENT DOCUMENTS

| | | | | |
|---|---|---|---|---|
| JP | 6-177703 | * | 6/1994 | 333/193 |

* cited by examiner

*Primary Examiner*—Barbara Summons
(74) *Attorney, Agent, or Firm*—Keating & Bennett, LLP

(57) ABSTRACT

A surface acoustic wave filter includes, on a piezoelectric substrate, longitudinally coupled resonator type surface acoustic wave filter sections, including interdigital transducers, each having a narrow-pitched electrode finger portion in an area where interdigital transducers are adjacent to each other, first surface acoustic wave resonators, between the surface acoustic wave filter sections and an input terminal, and second surface acoustic wave resonators between the surface acoustic wave filter sections and output terminals. The resonance point of the surface acoustic wave resonators falls within the passband of the surface acoustic wave filter sections, and the antiresonance point of the surface acoustic wave resonators is in the vicinity of the high frequency side of the passband.

25 Claims, 29 Drawing Sheets

SURFACE ACOUSTIC WAVE FILTER WITH A THREEFOLD MODE FILTER SECTION AND A RESONATOR

BACKGROUND OF THE INVENTION

1. Field of the Invention

The present invention relates to a surface acoustic wave filter and, more particularly, to a surface acoustic wave filter including a surface acoustic wave resonator connected in series with a surface acoustic wave filter section.

2. Description of the Related Art

Surface acoustic wave filters are commonly used as bandwidth filters in an RF stage in a mobile telephone.

For example, Japanese Unexamined Patent Application Publication No. 7-30367 discloses this sort of surface acoustic wave filter. FIG. 41 illustrates the arrangement of the electrodes of the disclosed surface acoustic wave filter. In a surface acoustic wave filter 2001, a surface acoustic wave resonator 2003 is connected in series with a serially coupled 3-IDT (interdigital transducer) resonator type surface acoustic wave filter section 2002. The antiresonance frequency of the surface acoustic wave resonator 2003 is on a high frequency side of the passband of the longitudinally coupled resonator type surface acoustic wave filter section 2002, while the resonance frequency of the surface acoustic wave resonator 2003 is within the passband. Since the antiresonance frequency of the surface acoustic wave resonator 2003 is on a high frequency side of the passband of the longitudinally coupled resonator type surface acoustic wave filter section 2002, attenuation in the vicinity of the high frequency side of the passband is increased. Since the resonance frequency falls within the passband, the transmission characteristic within the passband does not substantially suffer from degradation.

If the surface acoustic wave filter 2001 is used as a wideband filter such as a DSC filter having a wide passband width, the VSWR (Voltage-Standing-Wave Ratio) in a high-frequency region of the passband is not high enough. The effect of parasitic capacitances generated in a piezoelectric substrate and a package is predominant in a high frequency region of the filter, and the impedance of the filter is capacitive if a wideband filter feature is implemented.

This trend becomes pronounced in the high frequency region of the passband. A threefold mode filter is typically used to widen the band width. However, the frequency separation between three resonance modes naturally increases in an attempt to achieve the wideband feature. On the other hand, to balance impedance matching within the passband, the impedance matching is performed on a center resonance mode of the three resonance modes. The two remaining resonance modes in a low frequency and a high frequency region are thus not matched. In high frequency applications in particular, the effect of capacitance in the resonance mode in the high frequency region is pronounced. The impedance of the filter is inductive on the resonance mode in the low frequency region while being capacitive on the resonance mode in the high frequency region. The resonance mode in the high frequency region suffers from the effect of capacitance and thus, experiences the above-mentioned problem.

SUMMARY OF THE INVENTION

To overcome the problems described above, preferred embodiments of the present invention provide a surface acoustic wave filter which includes a surface acoustic wave resonator connected in series with a surface acoustic wave filter section and which has an outstanding VSWR in a wide passband.

In a first preferred embodiment of the present invention, a surface acoustic wave filter includes a surface acoustic wave filter section including a piezoelectric substrate, at least two IDTs arranged in a direction of propagation of a surface acoustic wave on the piezoelectric substrate, each of the IDTs having a narrow-pitched electrode finger portion at one end of the IDT including electrode fingers arranged at a pitch narrower than that of electrode fingers in the remaining portions thereof, at an area where the IDTs are adjacent to each other, and at least one surface acoustic wave resonator connected in series between the surface acoustic wave filter section and one of an input signal terminal and an output signal terminal. The surface acoustic wave filter section is a threefold mode surface acoustic wave filter section of a longitudinally coupled resonator type, and impedance of the surface acoustic wave filter section is capacitive in a resonance mode in the highest frequency region of three resonance modes. The resonance point of the surface acoustic wave resonator is within a passband of the surface acoustic wave filter section, and the antiresonance point of the surface acoustic wave resonator is in the vicinity of the high frequency region of the passband of the surface acoustic wave filter section. The surface acoustic wave resonator is arranged such that the impedance in the resonance mode in the highest frequency region is close to an impedance matching point.

Preferably, at least a portion of the IDT is weighted in an area where a plurality of IDTs are disposed adjacent to each other in the surface acoustic wave filter section. Weighting the portion of the IDT improves the out-of-passband characteristics of the filter. An unbalance-balance converting function compensates for an amplitude deviation and a phase shift from a phase difference of 180° in a signal output from a circuit between an unbalanced signal terminal and one of the balanced signal terminals with respect to an input signal to a circuit between the unbalanced signal terminal and the other of the balanced signal terminals.

Preferably, the surface acoustic wave filter section includes an odd number of IDTs, and at least one surface acoustic wave resonator is connected between the surface acoustic wave filter section and one of the input signal terminal and the output signal terminal having a greater number of IDTs connected thereto. The VSWR is thus further improved.

Preferably, the surface acoustic wave resonators include at least one surface acoustic wave resonator connected in series between the surface acoustic wave filter section and the input signal terminal, and at least one surface acoustic wave resonator connected in series between the surface acoustic wave filter section and the output signal terminal. The VSWR is thus further improved.

In a second preferred embodiment of the present invention, a surface acoustic wave filter includes a surface acoustic wave filter section including a piezoelectric substrate, at least two IDTs arranged in a direction of propagation of a surface acoustic wave on the piezoelectric substrate, and a reflector arranged between adjacent IDTs and having a plurality of electrode fingers at an electrode finger pitch that is different from the finger pitch of the IDTs, and at least one surface acoustic wave resonator connected in series between the surface acoustic wave filter section and one of an input signal terminal and an output signal terminal.

The surface acoustic wave filter section is a longitudinally coupled resonator type, threefold mode surface acoustic wave filter section, and impedance of the surface acoustic wave filter section is capacitive in a resonance mode in the highest frequency region of the three resonance modes. The resonance point of the surface acoustic wave resonator is within a passband of the surface acoustic wave filter section, and the antiresonance point of the surface acoustic wave resonator is in the vicinity of the high frequency region of the passband of the surface acoustic wave filter section. The surface acoustic wave resonator is arranged such that the impedance in the resonance mode in the highest frequency region is close to an impedance matching point.

Preferably, the surface acoustic wave filter section includes an odd number of IDTs, and at least one surface acoustic wave resonator is connected between the surface acoustic wave filter section and one of the input signal terminal and the output signal terminal having a greater number of IDTs connected thereto. The VSWR is thus further improved.

The surface acoustic wave resonators preferably include at least one surface acoustic wave resonator connected in series between the surface acoustic wave filter section and the input signal terminal, and at least one surface acoustic wave resonator connected in series between the surface acoustic wave filter section and the output signal terminal. The VSWR is thus further improved.

Preferably, the surface acoustic wave filter includes a plurality of surface acoustic wave resonators connected between the surface acoustic wave filter section and at least one of the input signal terminal and the output signal terminal.

At least one of the input signal terminal and the output signal terminal preferably includes a pair of balanced signal terminals.

Preferably, the input signal terminal and the output signal terminal function is an unbalance-balance converter with one of the input signal terminal and output signal terminal being a balanced signal terminal, and the other of the input signal terminal and output signal terminal being an unbalanced signal terminal.

Preferably, the surface acoustic wave filter section includes a first surface acoustic wave filter block and a second surface acoustic wave filter block, each outputting an output signal different in phase by 180° from a signal input thereto. Ends of the first and second surface acoustic wave filter blocks are connected together and function as an unbalanced signal terminal, and the other ends of the first and second surface acoustic wave filter blocks and function as balanced signal terminals.

Preferably, the surface acoustic wave filter section includes a single surface acoustic wave filter block, terminals of the surface acoustic wave filter block function as a pair of balanced signal terminals, and the other terminal of the surface acoustic wave filter block functions as an unbalanced signal terminal.

At least one IDT of the surface acoustic wave filter section preferably includes first and second separate IDT sections split in a direction across the electrode finger or in a direction of propagation of a surface acoustic wave.

The surface acoustic wave resonator and the surface acoustic wave filter section are preferably provided on the same piezoelectric substrate. The surface acoustic wave resonator is thus produced as a single chip component.

Preferably, the surface acoustic wave filter further includes a case plate, wherein the piezoelectric substrate is mounted on the case plate such that the side of the piezoelectric substrate having the surface acoustic wave filter section and the surface acoustic wave resonator provided thereon faces the case plate. In accordance with preferred embodiments of the present invention, a surface acoustic wave filter device having a surface acoustic wave filter element mounted on the case plate is preferably manufactured using flip-chip technique.

In a third preferred embodiment of the present invention, a communication apparatus includes the surface acoustic wave filter according to preferred embodiments of the present invention. The communication apparatus of the present invention includes a surface acoustic wave filter having a wide bandwidth and excellent VSWR.

Other features, elements, characteristics and advantages of the present invention will become more apparent from the following detailed description of preferred embodiments of the present invention with reference to the attached drawings.

DETAILED DESCRIPTION OF PREFERRED EMBODIMENTS

The preferred embodiments of the present invention will now be discussed.

Figure 1:
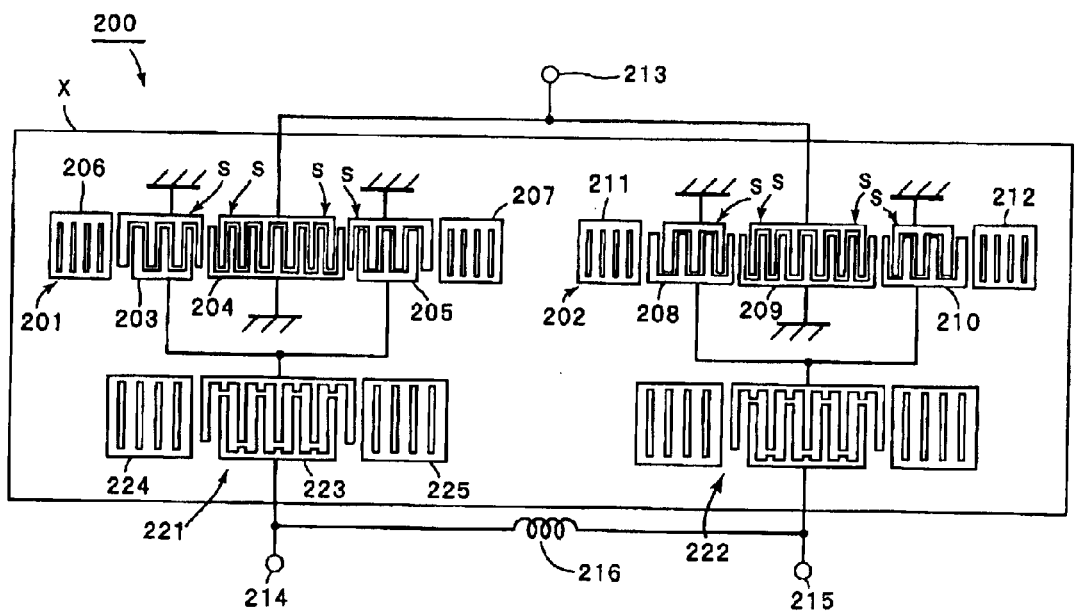
FIG. 1 is a plan view diagrammatically showing an electrode structure of a surface acoustic wave filter of a first preferred embodiment of the present invention.

FIG. 1 is a plan view diagrammatically showing an electrode structure of a surface acoustic wave filter of a first preferred embodiment of the present invention. In the first preferred embodiment, the present invention is applied to a surface acoustic wave filter having unbalance-balance converting function for DSC receiving. The impedance of unbalanced signal terminals is about 50 Ω while the impedance of balanced signal terminals is about 150 Ω.

As shown, an electrode structure, preferably made of Al, is arranged on a piezoelectric substrate X (with only the outline thereof diagrammatically shown). The piezoelectric substrate X is preferably a 40±5° Y-cut, X-propagating $LiTaO_3$ substrate.

A longitudinally coupled resonator type surface acoustic wave filter section 201 includes IDTs 203 through 205 arranged in a direction of propagation of a surface acoustic wave. Reflectors 206 and 207 are respectively arranged at both ends of a region bearing the IDTs 203 through 205 along the direction of propagation of the surface acoustic wave.

As shown in FIG. 1, each IDT includes several electrode fingers located at an end thereof having an electrode finger pitch that is narrower, in an area where the IDTs 203 and 204 are adjacent to each other and in an area where the IDTs 204 and 205 are adjacent to each other, than an electrode finger pitch of the remaining portions of each IDT. Specifically, a narrow-pitched electrode finger portion represented by the arrow S in FIG. 1 is provided. With the narrow-pitched electrode finger portion provided in each of the IDTs 203 through 205, insertion loss in the passband of the filter is greatly reduced.

Like the longitudinally coupled resonator type surface acoustic wave filter section 201, a longitudinally coupled resonator type surface acoustic wave filter section 202 also preferably includes three IDTs 208 through 210 and reflectors 211 and 212. A narrow-pitched portion represented by the arrow S is also provided in each of the IDTs 208 through 210 in an area where the IDTs 208 and 209 are adjacent to each other and in an area where the IDTs 209 and 210 are adjacent to each other.

The IDTs 208 and 210 in the longitudinally coupled resonator type surface acoustic wave filter section 202 are inverted with respect to the IDTs 203 and 205 in the longitudinally coupled resonator type surface acoustic wave filter section 201. Specifically, the phase of an output signal of the longitudinally coupled resonator type surface acoustic wave filter section 202, responsive to a signal input thereto, is shifted by 180° from an output signal from the longitudinally coupled resonator type surface acoustic wave filter section 201.

Referring to FIG. 1, an input terminal is an unbalanced signal terminal 213, while output terminals are a pair of balanced signal terminals 214 and 215. An inductance element 216 is connected between the balanced signal terminals 214 and 215. In the first preferred embodiment, an inductance element of about 18 nH, for example, is preferably used for the inductance element 216.

A surface acoustic wave resonator 221 is serially connected between the longitudinally coupled resonator type surface acoustic wave filter section 201 and the balanced signal terminal 214. Similarly, a surface acoustic wave resonator 222 is connected between the longitudinally coupled resonator type surface acoustic wave filter section 202 and the balanced signal terminal 215.

Specifically, in the first preferred embodiment, the IDTs 203 and 205 in the longitudinally coupled resonator type surface acoustic wave filter section 201 are connected to the surface acoustic wave resonator 221. Also, in the longitudinally coupled resonator type surface acoustic wave filter section 202, the IDTs 208 and 210 are connected to the surface acoustic wave resonator 222.

The surface acoustic wave resonator 221 has reflectors 224 and 225 provided at both ends of a single IDT 223 in the direction of propagation of the surface acoustic wave. The surface acoustic wave resonator 221 is a one-port type surface acoustic wave resonator having reflectors. The surface acoustic wave resonator 222 also has an identical structure.

Alternatively, the surface acoustic wave resonators 221 and 222 having no reflector may be used.

To simplify the drawings, the number of electrode fingers in each of the longitudinally coupled resonator type surface acoustic wave filter sections 201 and 202, and surface acoustic wave resonators 221 and 222 in FIG. 1 is less than the actual number of electrode fingers.

In the first preferred embodiment, the surface acoustic wave resonators 221 and 222 are preferably substantially identical in structure to each other. The resonance frequencies of the surface acoustic wave resonators 221 and 222 fall within the passbands of the longitudinally coupled resonator type surface acoustic wave filter sections 201 and 202, respectively, and the antiresonance frequencies of the surface acoustic wave resonators 221 and 222 are in the vicinities of the high frequency sides of the passbands of the longitudinally coupled resonator type surface acoustic wave filter sections 201 and 202, respectively. As test results will show later, the use of the surface acoustic wave resonators 221 and 222 provides, close to an impedance matching point at each of an input terminal and an output terminal, each of the impedances of the longitudinally coupled resonator type surface acoustic wave filter sections 201 and 202 in a resonance mode in the highest frequency region, out of resonance modes thereof. VSWR characteristics are thus greatly improved.

A specific design of the longitudinally coupled resonator type surface acoustic wave filter section 201 of the first preferred embodiment will now be described. In the first preferred embodiment, the electrode finger pitches in the narrow-pitched electrode finger portions of the IDTs 203 through 205 and IDTs 208 through 210 are equalized. λI1 represents the surface acoustic wave determined by the electrode finger pitch of the remaining portion other than the narrow-pitched electrode finger portion.

Design specifications of the filter are as follows:

Transverse width W=about 41.8λI1

Electrode fingers of each of the IDTs 203 and 205: number of electrode fingers in the narrow-pitched electrode finger portion=3 and number of electrode fingers in the remaining electrode finger portion=18

Electrode fingers of the IDT 204: number of electrode fingers in the narrow-pitched electrode finger portion=3 (in each portion adjacent to the IDTs 203 and 205), and number of electrode fingers in the remaining electrode finger portion=33

Number of electrode fingers in each of the reflectors 206 and 207=90

Duty factor of each of the IDTs=about 0.72

Duty factor of each of the reflectors 206 and 207=about 0.57

Thickness of the electrode finger=about 0.092λI1

The longitudinally coupled resonator type surface acoustic wave filter section 202 is identical in configuration to the longitudinally coupled resonator type surface acoustic wave filter section 201, except that the alignment of the IDTs 208 and 210 are opposite to the alignment of the IDTs 203 and 205, and that the number of electrode fingers of the reflector is 60.

Optionally, the longitudinally coupled resonator type surface acoustic wave filter sections 201 and 202 may have different configurations to improve the degree of balance between the balanced signal terminals 214 and 215, and to increase attenuation in the stopband. As long as such an optional design satisfies the configuration of the present invention, the advantages of the present invention are still provided.

The design specifications of the surface acoustic wave resonators 221 and 222 are as follows:

Transverse width=about 23.6λ

Number of electrode fingers of the IDT=241

Number of electrode fingers of the reflector=30

Duty factor=about 0.60

Electrode thickness=about 0.093λ

The surface acoustic wave resonators 221 and 222 are preferably substantially identical to each other. Optionally, the surface acoustic wave resonators 221 and 222 may be different in design from each other to improve the degree of balance between the balanced signal terminals 214 and 215, and to increase attenuation in the stopband. Such an optional design still provides the advantages of the present invention as long as the resonance frequency falls within the passband of each of the longitudinally coupled resonator type surface acoustic wave filter sections 201 and 202, and the antiresonance frequency is in the vicinity of the high frequency region of the passband.

Figure 2:
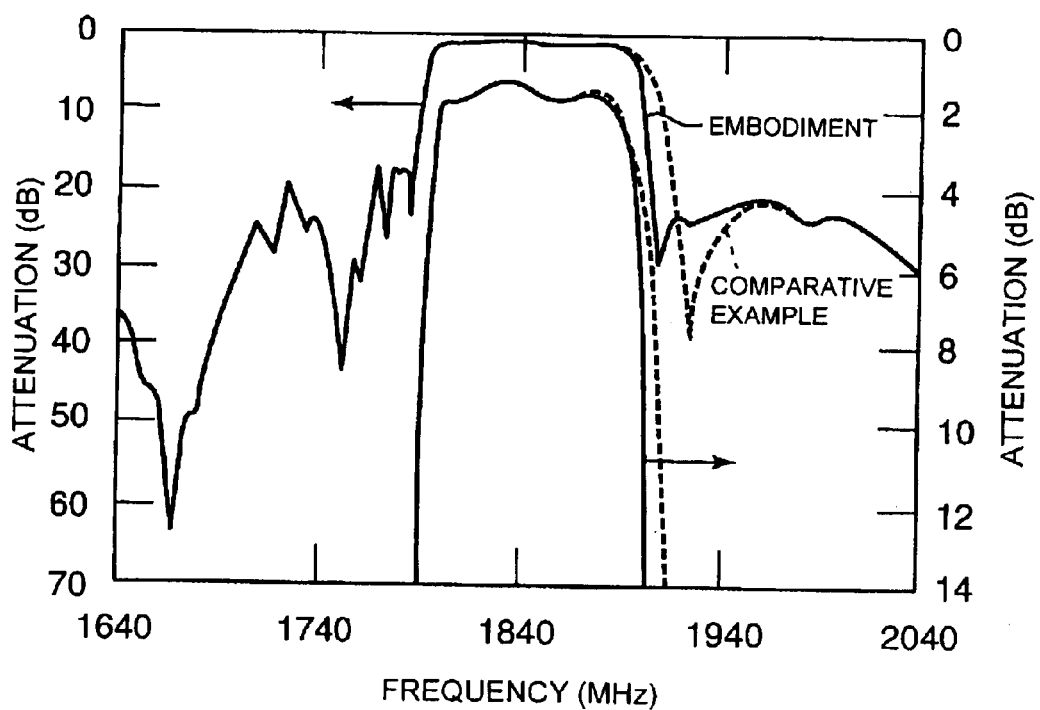
FIG. 2 plots transmission characteristics of the surface acoustic wave filter of the first preferred embodiment and the surface acoustic wave filter of a comparative example.
Figure 3:
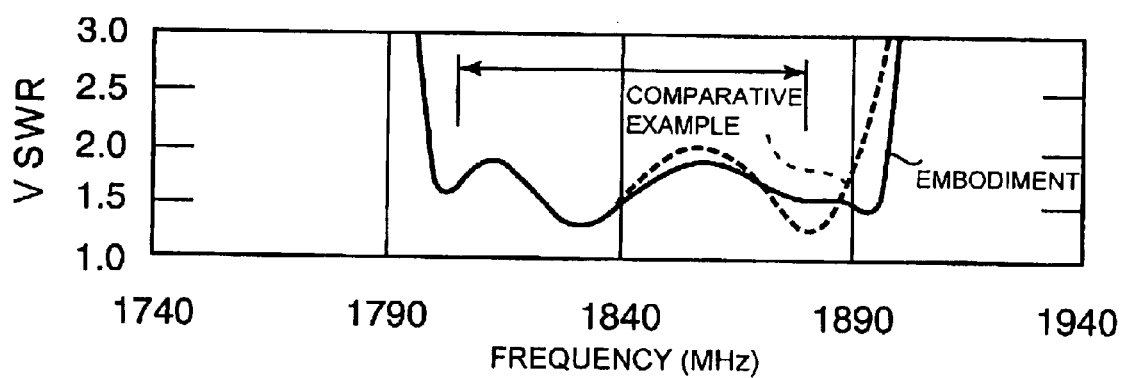
FIG. 3 plots input VSWR characteristics of the surface acoustic wave filter of the first preferred embodiment and the surface acoustic wave filter of the comparative example.
Figure 4:
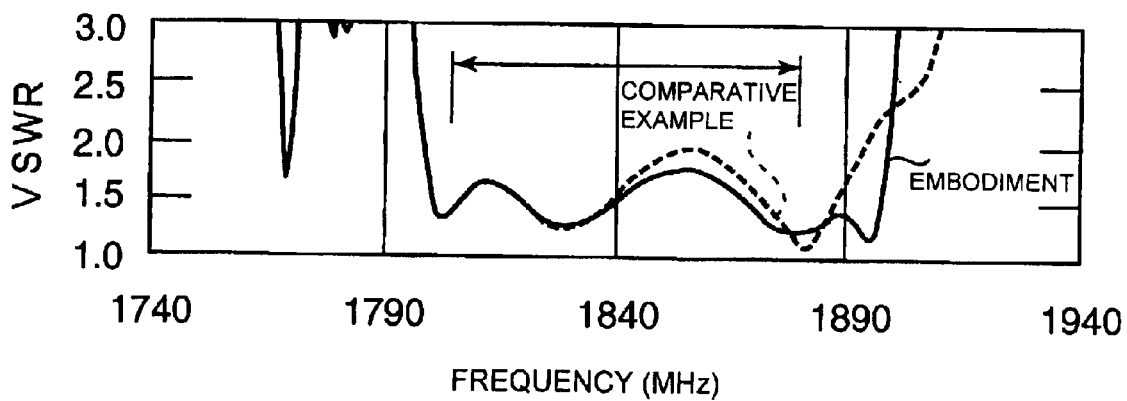
FIG. 4 plots output VSWR characteristics of the surface acoustic wave filter of the first preferred embodiment and the surface acoustic wave filter of the comparative example.

FIG. 2 plots, in a solid line, transmission characteristics of the surface acoustic wave filter 200 constructed in accordance with the first preferred embodiment of the present invention. FIG. 3 plots, in a solid line, the VSWR characteristics of the surface acoustic wave filter 200 at the input side thereof (at the unbalanced terminal 215), and FIG. 4 plots, in a solid line, the VSWR characteristics of the surface acoustic wave filter 200 at the output side thereof (at the balanced signal terminals 214 and 215). For comparison, characteristics of the surface acoustic wave filter of a comparative example are identified by broken line in FIGS. 2 through 4.

The surface acoustic wave filter of the comparative example has a conventional structure in which the surface acoustic wave resonators 221 and 222 are respectively connected in series with the longitudinally coupled resonator type surface acoustic wave filter sections 201 and 202 such that the attenuation in the high frequency region of the passband increases. In the comparative example, the wavelength determined by the pitch of the surface acoustic wave resonators 221 and 222 is shortened by about 1%. The rest of the construction of the comparative example remains unchanged from the first preferred embodiment of the present invention.

The frequency range of the passband of a DCS receiving filter is about 1805 MHz to about 1880 MHz. If the VSWR characteristics of the surface acoustic wave filters of the first preferred embodiment and the comparative example are compared within that frequency range, the first preferred embodiment is greatly improved as compared to the comparative example as shown in FIGS. 3 and 4. Specifically, the comparative example results in a VSWR of about 2.1 at the input and a VSWR of about 1.9 at the output while the first preferred embodiment results in a VSWR of about 1.8 at the input and a VSWR of about 1.7 at the output. The first preferred embodiment this improves the VSWR by about 0.3 at the input and about 0.2 at the output as compared to the comparative example. As shown in FIG. 2, the surface acoustic wave filter of the first preferred embodiment is degraded in attenuation of transmission characteristics by about 1 dB with respect to the comparative example within a high frequency region of passband of about 1920 to about 1980 MHz, but there is no significant difference within the passband.

The surface acoustic wave filter of the first preferred embodiment improves the VSWR as compared to the surface acoustic wave filter of the comparative example without significantly degrading the transmission characteristics of the passband.

Figure 5:
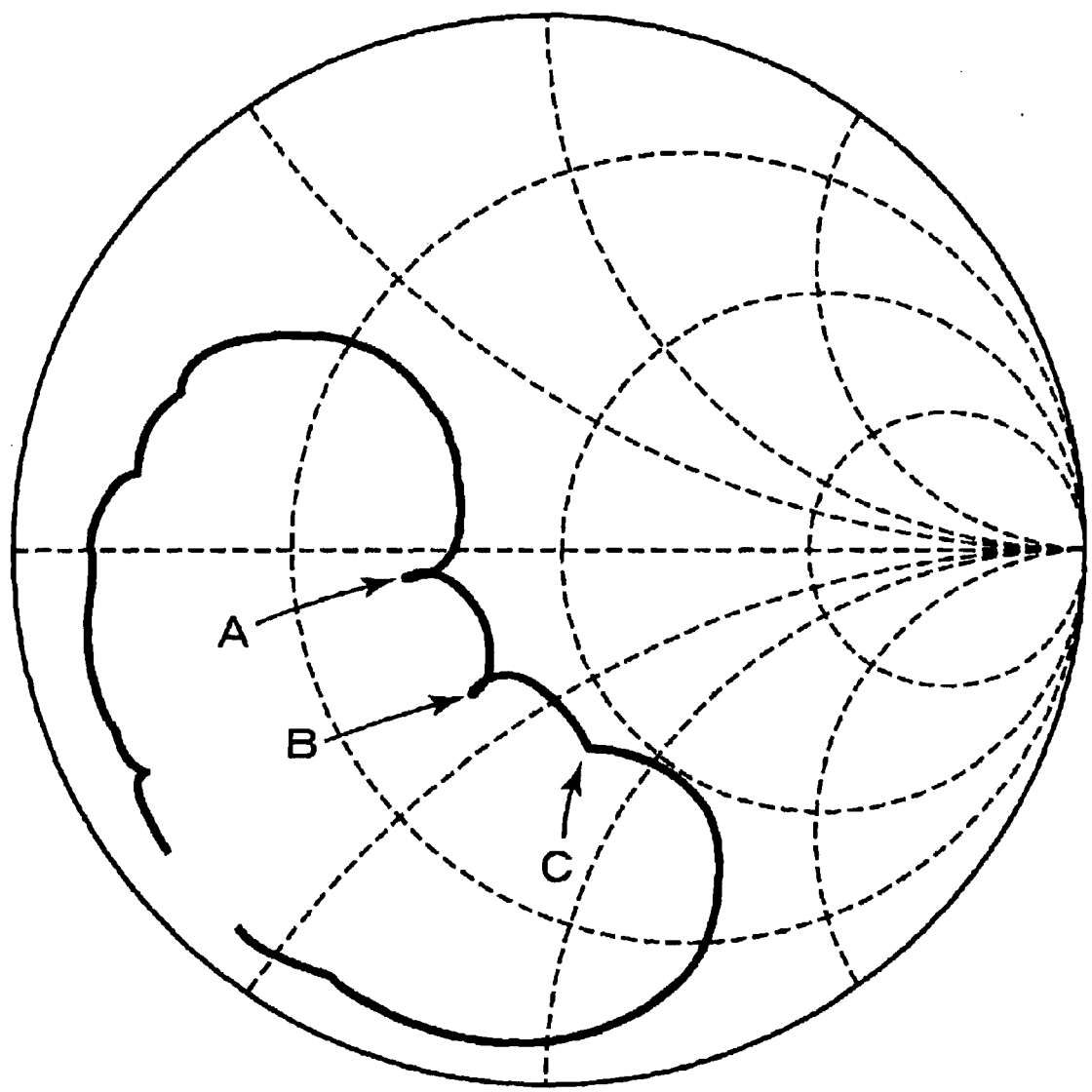
FIG. 5 plots, in the Smith chart, reflective characteristics S11 of the surface acoustic wave filter of FIG. 1.
Figure 6:
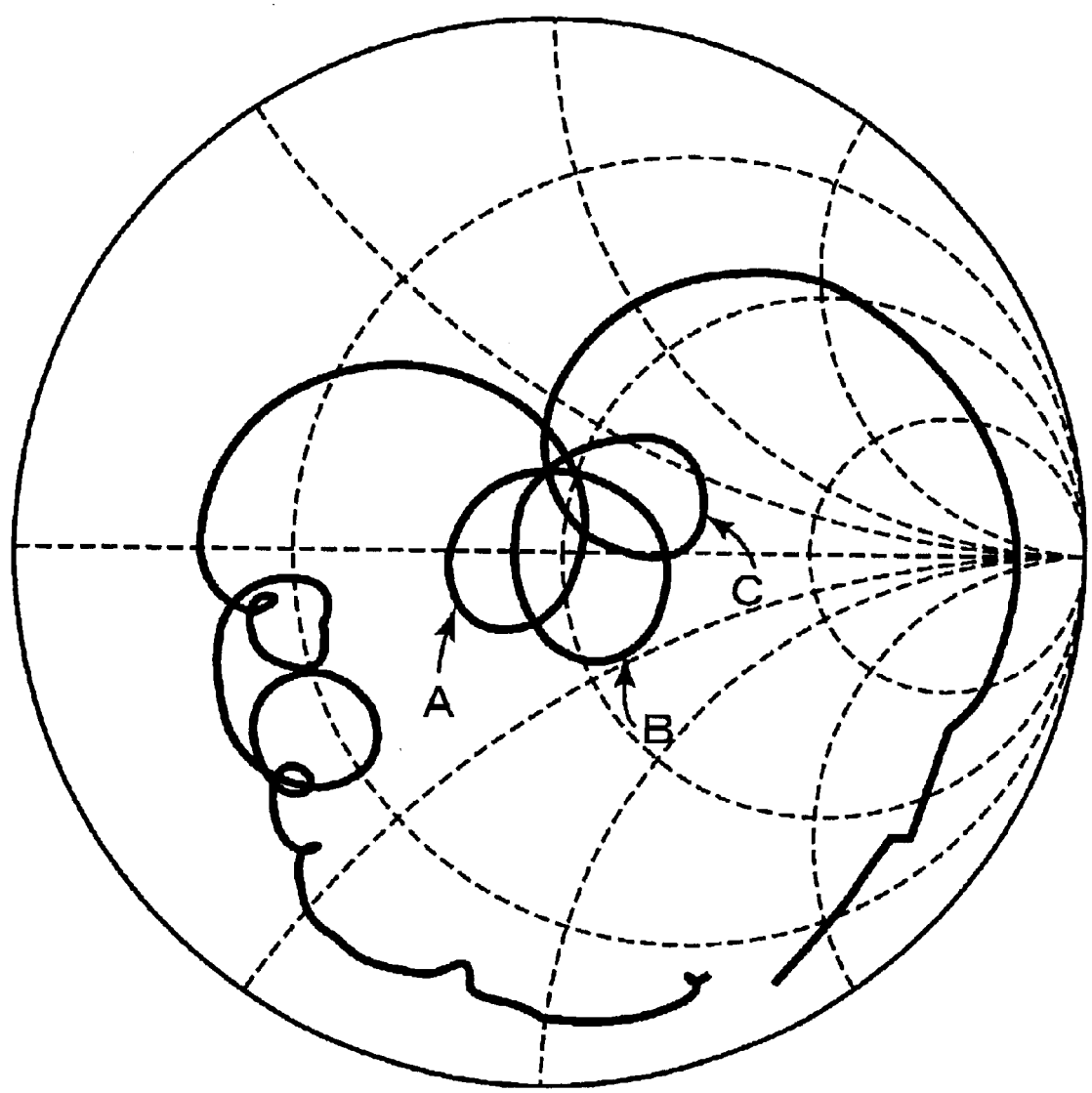
FIG. 6 plots, in the Smith chart, reflective characteristics S22 of the surface acoustic wave filter of FIG. 1.

FIG. 5 plots, in the Smith chart, reflective characteristics S11 of the surface acoustic wave filter at the input thereof, and FIG. 6 plots, in the Smith chart, reflective characteristics S22 of the surface acoustic wave filter at the output thereof. FIGS. 5 and 6 show that resonance modes A through C are available. Specifically, the surface acoustic wave filter 200 is a longitudinally coupled resonator type threefold mode surface acoustic wave filter.

Figure 7A:
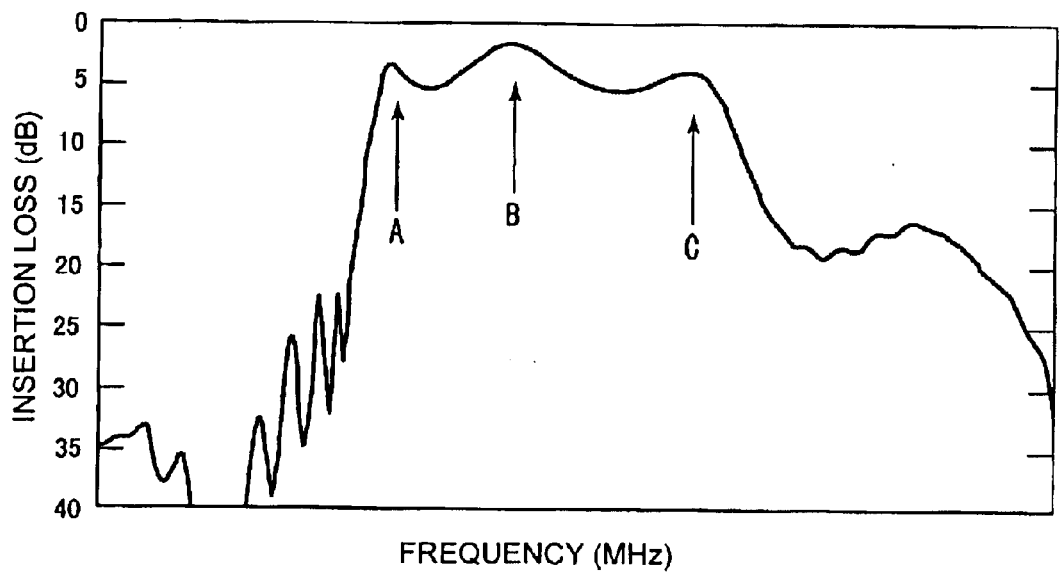
FIG. 7A plots the transmission characteristics of the surface acoustic wave filter of the first preferred embodiment showing the relationship between a plurality of generated resonance modes and frequencies thereof, and FIG. 7B explains the resonance modes.
Figure 7B:
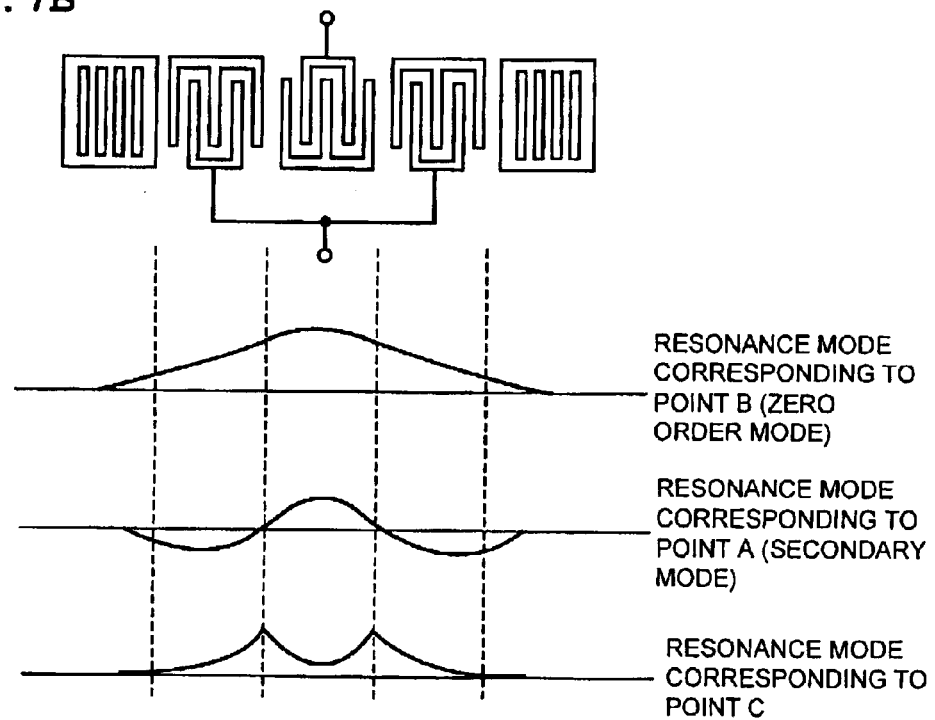

FIG. 7A plots the transmission characteristics of the surface acoustic wave filter of the first preferred embodiment in a wider frequency range. The resonance modes identified by the arrows A through C are shown in the attenuation-frequency characteristics. Referring to FIG. 7B, the longitudinally coupled resonator type surface acoustic wave filter having three IDTs defines a passband of three modes, namely, a zero-order mode (the resonance mode identified by the arrow B), a secondary mode (the resonance mode identified by the arrow A), and a mode (identified by the arrow C) having a peak in the intensity distribution of the surface acoustic wave.

Figure 8:
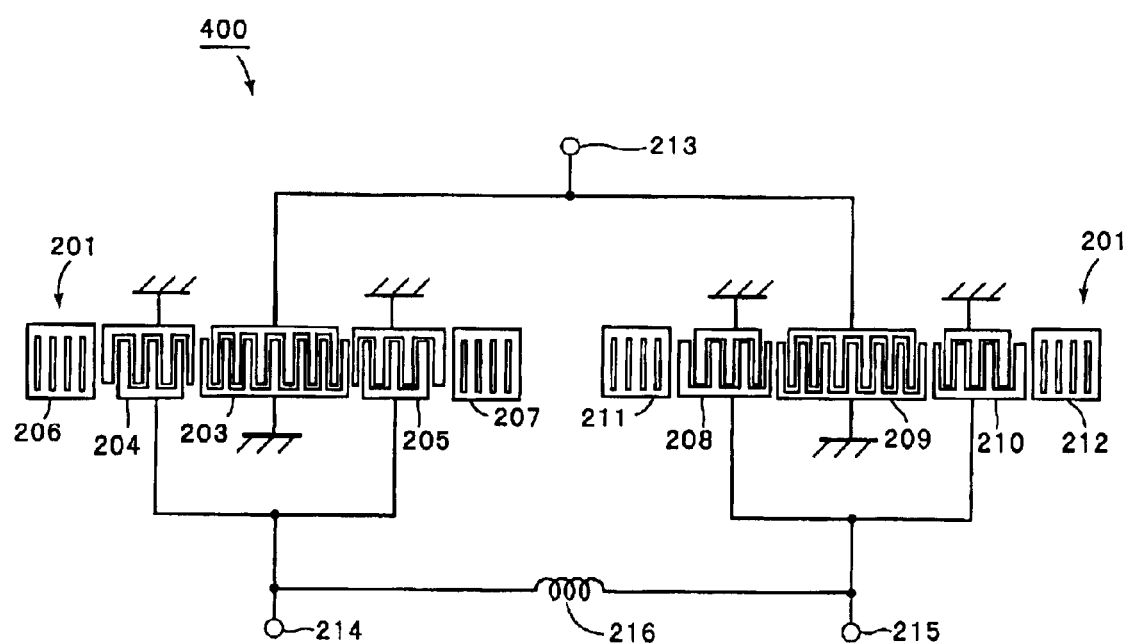
FIG. 8 is a plan view diagrammatically showing the surface acoustic wave filter of the first preferred embodiment with a surface acoustic wave resonator removed therefrom.

A longitudinally coupled resonator type surface acoustic wave filter 400 is manufactured by removing the surface acoustic wave resonators 221 and 222 from the surface acoustic wave filter 200 as shown in FIG. 8. The surface acoustic wave filter 400 includes only longitudinally coupled resonator type surface acoustic wave filter sections 201 and 202.

Figure 9:
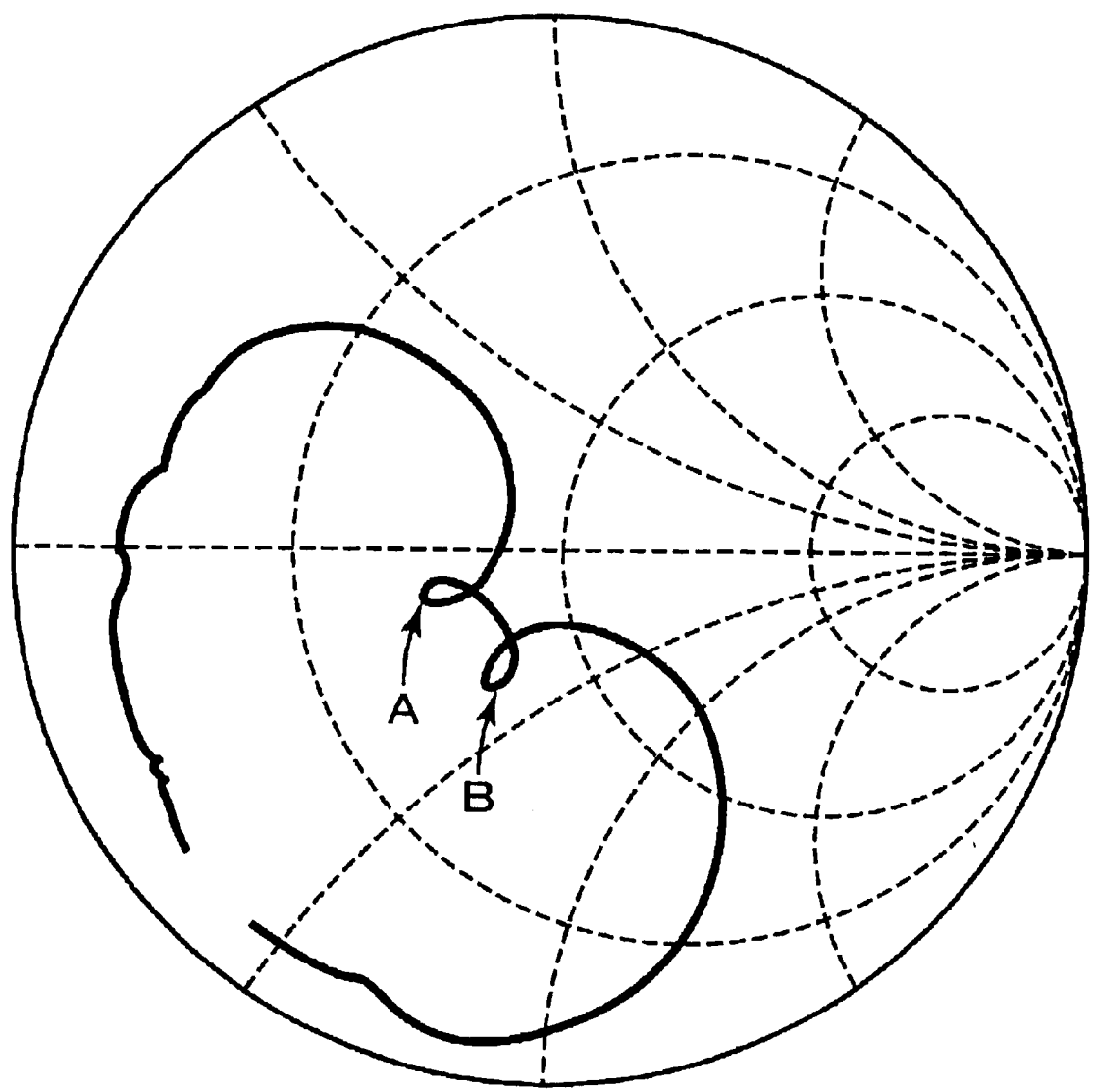
FIG. 9 plots, in the Smith chart, reflective characteristics S11 of the surface acoustic wave filter having the structure shown in FIG. 8.
Figure 10:
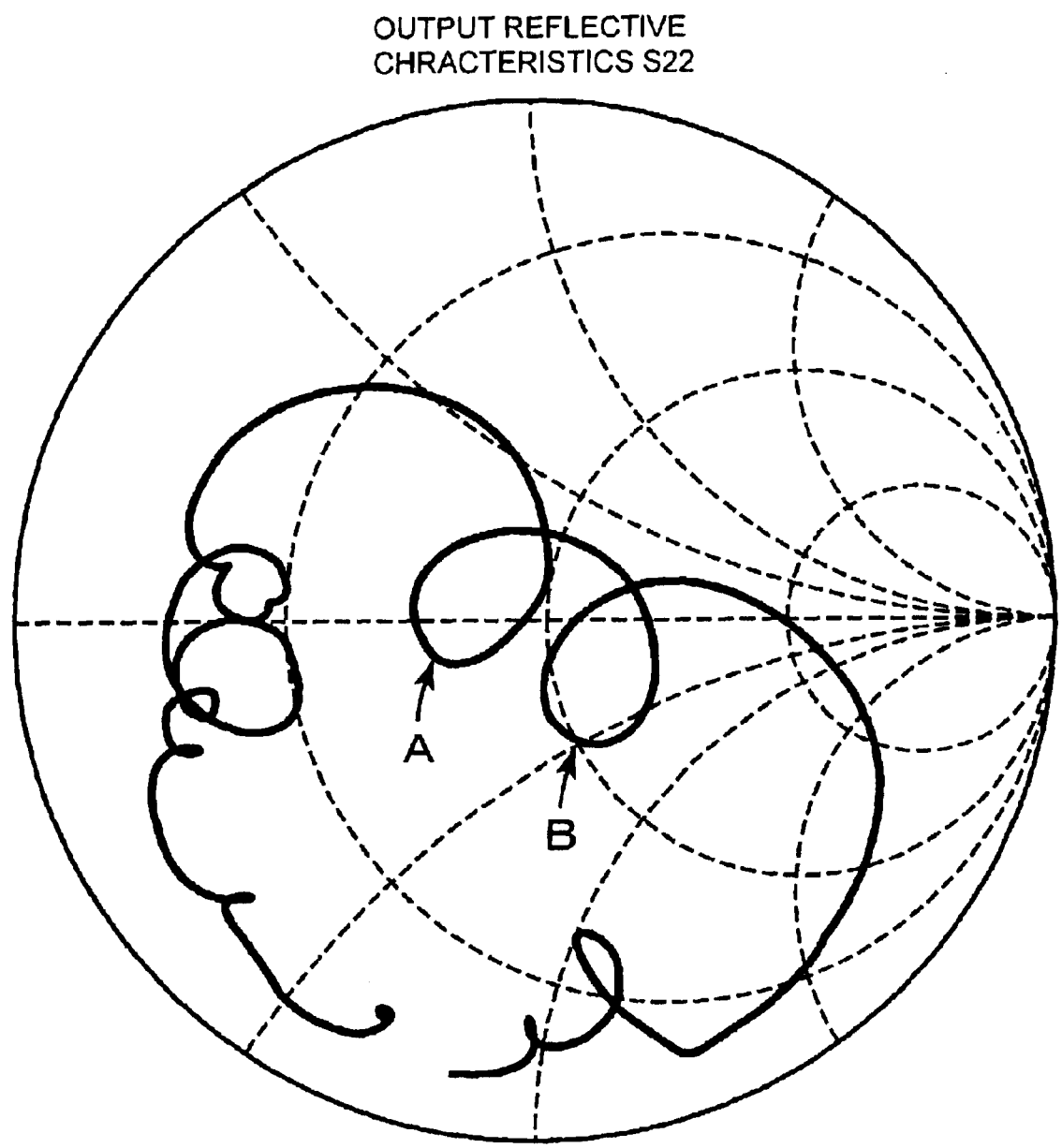
FIG. 10 plots, in the Smith chart, reflective characteristics S22 of the surface acoustic wave filter having the structure shown in FIG. 8.

FIGS. 9 and 10 are Smith charts respectively showing reflective characteristics S11 of the surface acoustic wave filter 400 at the input thereof and reflective characteristics S22 of the surface acoustic wave filter 400 at the output thereof. A comparison of FIGS. 9 and 10 with FIGS. 5 and 6 reveals that the resonance mode C disappears. This does not mean that the resonance mode C is non-existent. The resonance mode C is simply not recognized in the Smith chart because the resonance mode C is generated at a location far from the impedance matching point.

Figure 11:
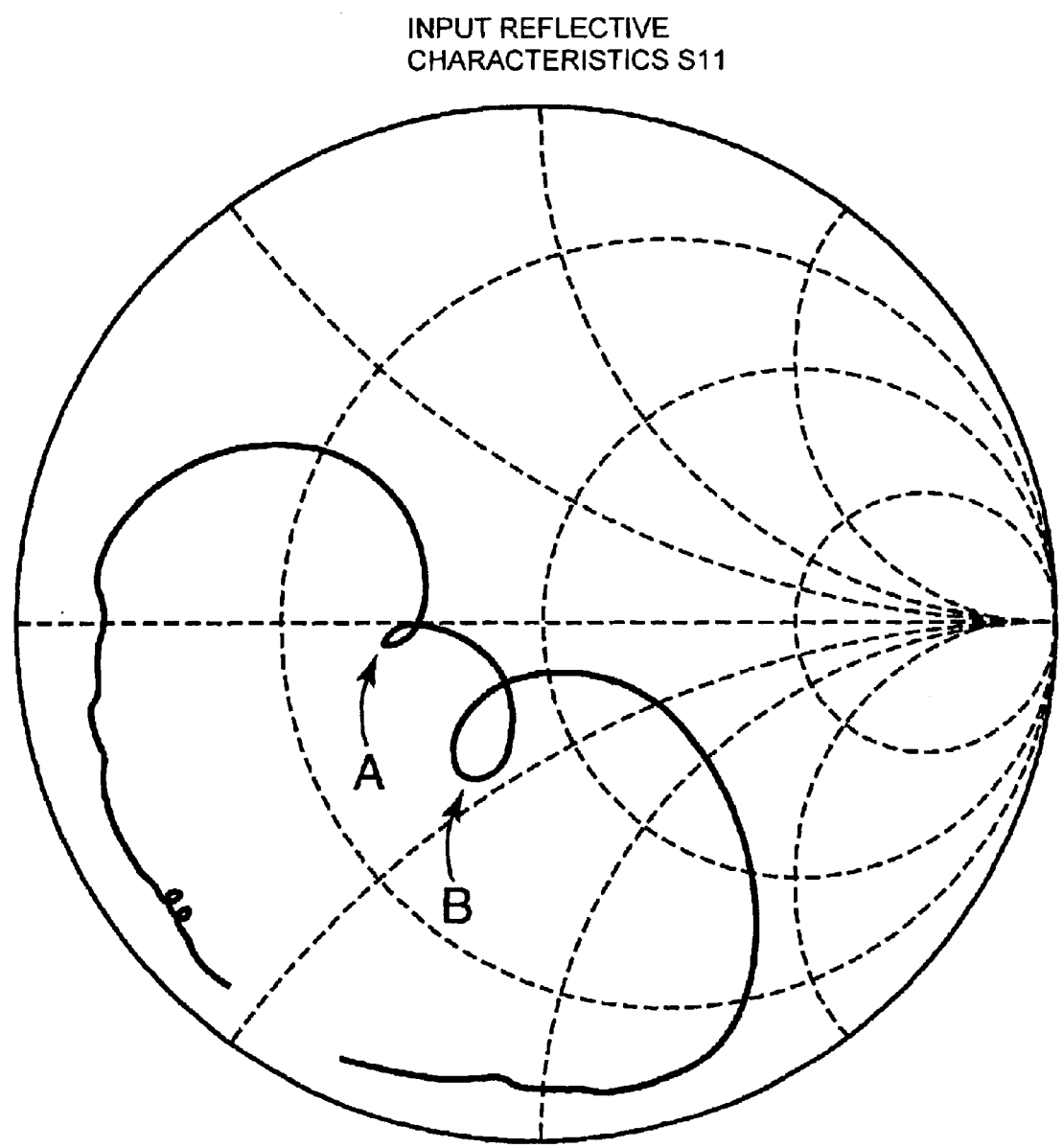
FIG. 11 plots the reflective characteristics S11 at the input of the surface acoustic wave filter of the comparative example.
Figure 12:
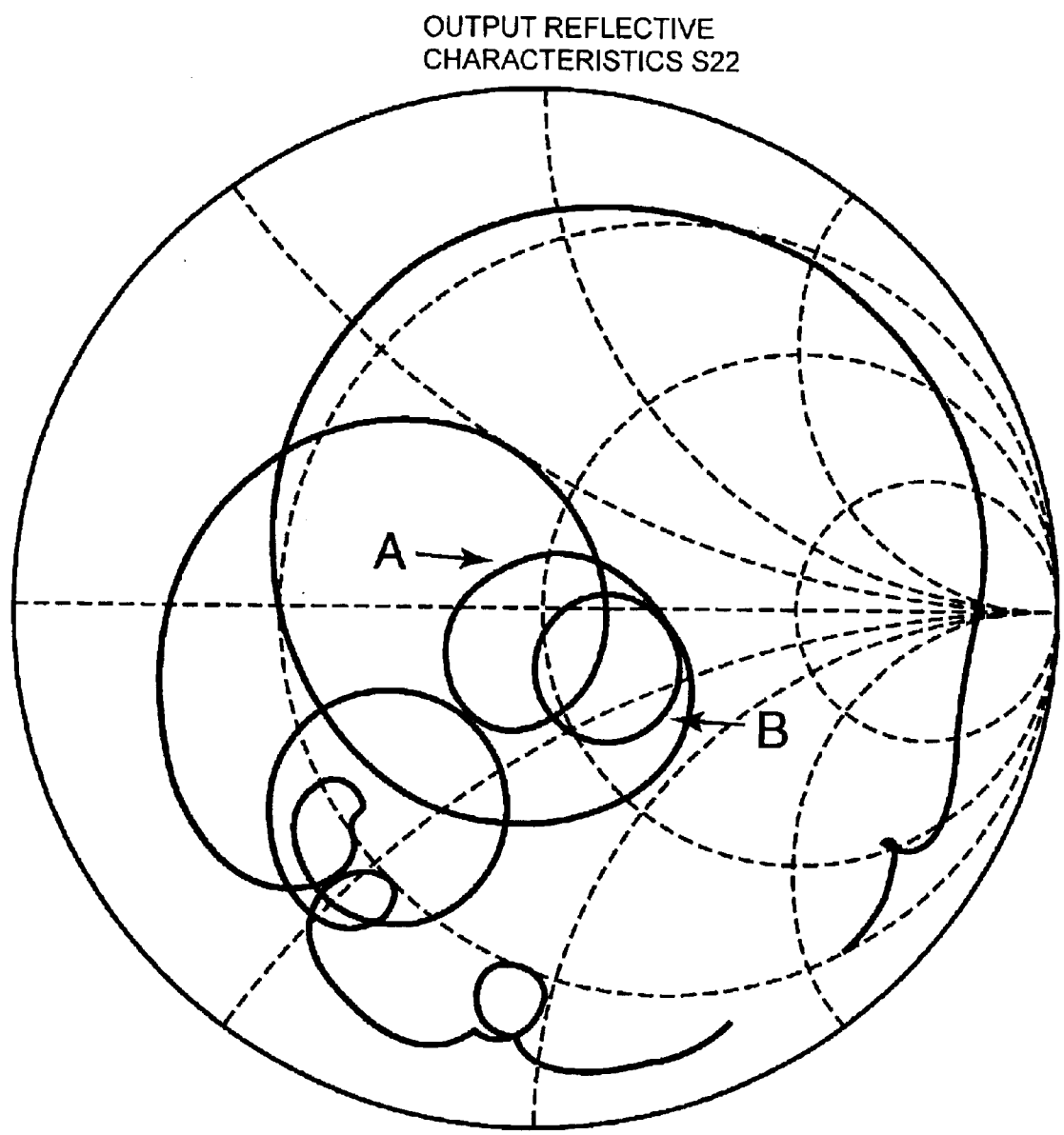
FIG. 12 plots, in the Smith chart, the reflective characteristics S22 at the output of the surface acoustic wave filter of the comparative example.

Similarly, FIGS. 11 and 12 are Smith charts respectively showing reflective characteristics S11 of the comparative example at the input thereof and reflective characteristics S22 of the comparative example at the output thereof. A comparison of FIGS. 11 and 12 with FIGS. 5 and 6 reveals that the resonance mode C is not recognized as in the reflective characteristics of the surface acoustic wave filter 400 shown in FIG. 8. Since the surface acoustic wave resonators 221 and 222 are constructed to attain attenuation in the high frequency side of the passband in the surface acoustic wave filter of the comparative example, the resonance mode C of the longitudinally coupled resonator type surface acoustic wave filter sections 201 and 202 is not sufficiently close to the impedance matching point. In other words, the surface acoustic wave filter 200 of the first preferred embodiment includes the surface acoustic wave resonators 221 and 222 in which the resonance mode C is set to be close to the impedance matching point. The VSWR characteristics are thus improved.

Figure 13:
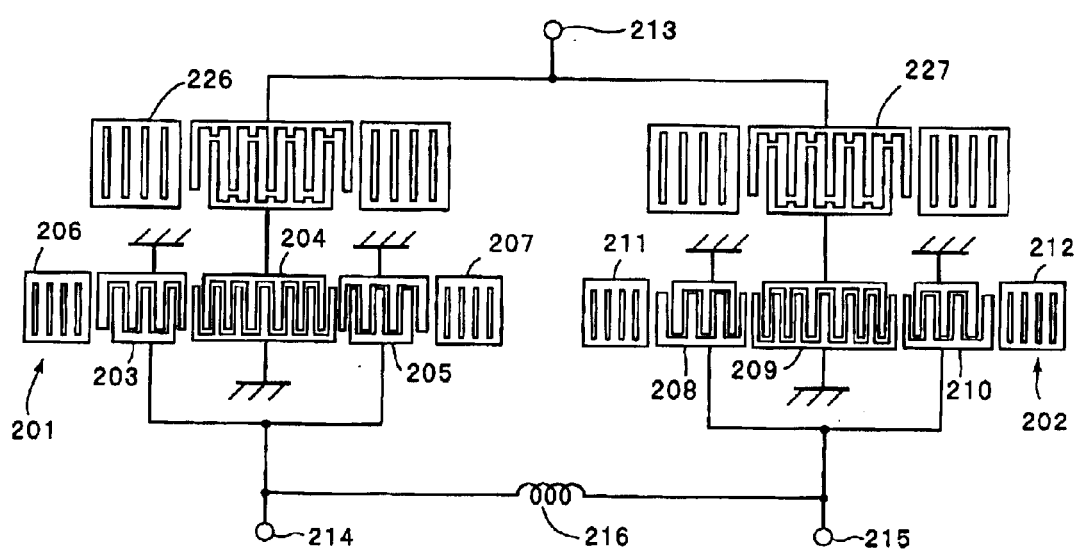
FIG. 13 is a plan view showing the electrode structure of the surface acoustic wave filter of the first preferred embodiment with two surface acoustic wave resonators removed therefrom.
Figure 14:
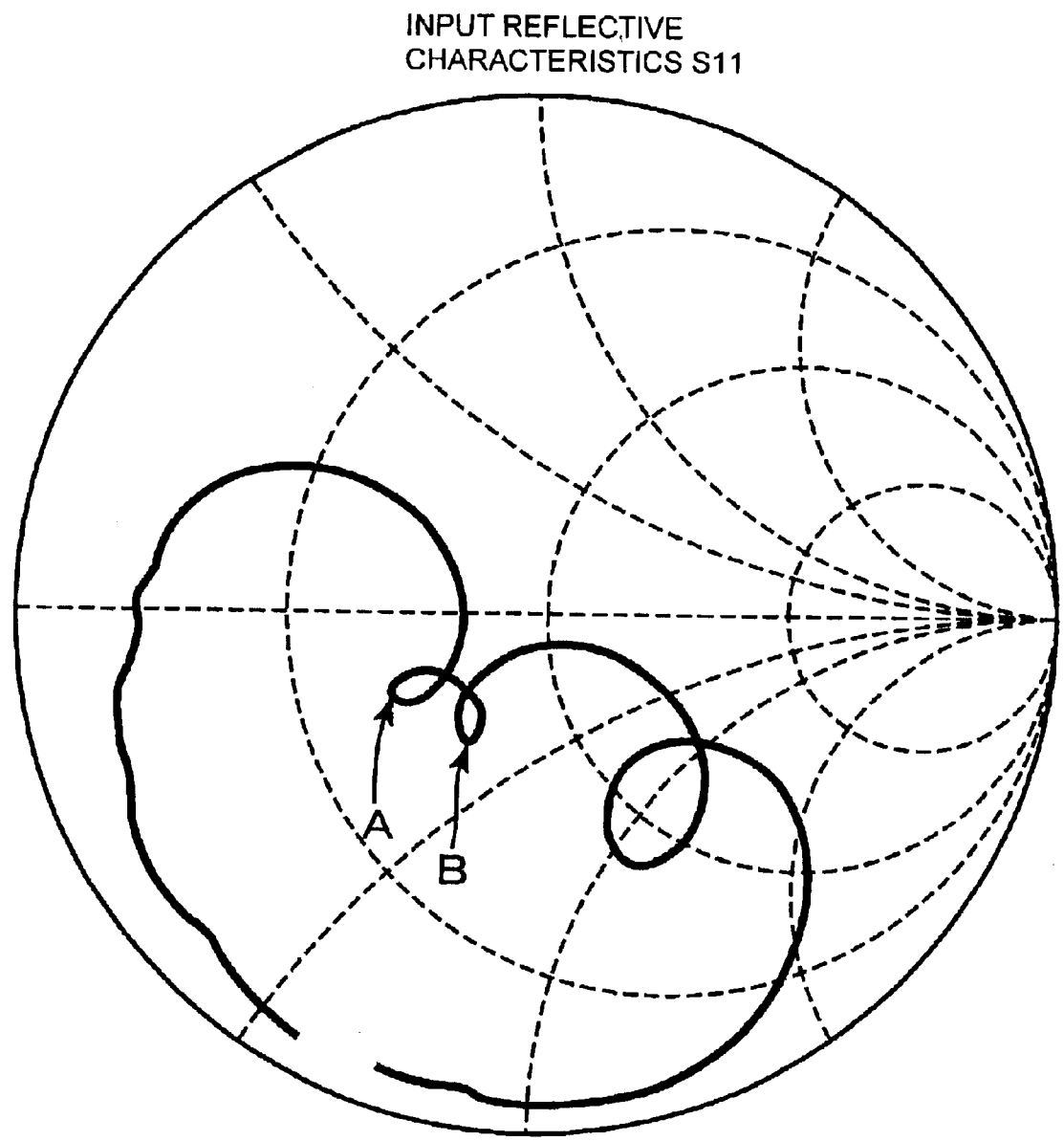
FIG. 14 plots, in the Smith chart, the reflective characteristics S11 of the surface acoustic wave filter shown in FIG. 13.
Figure 15:
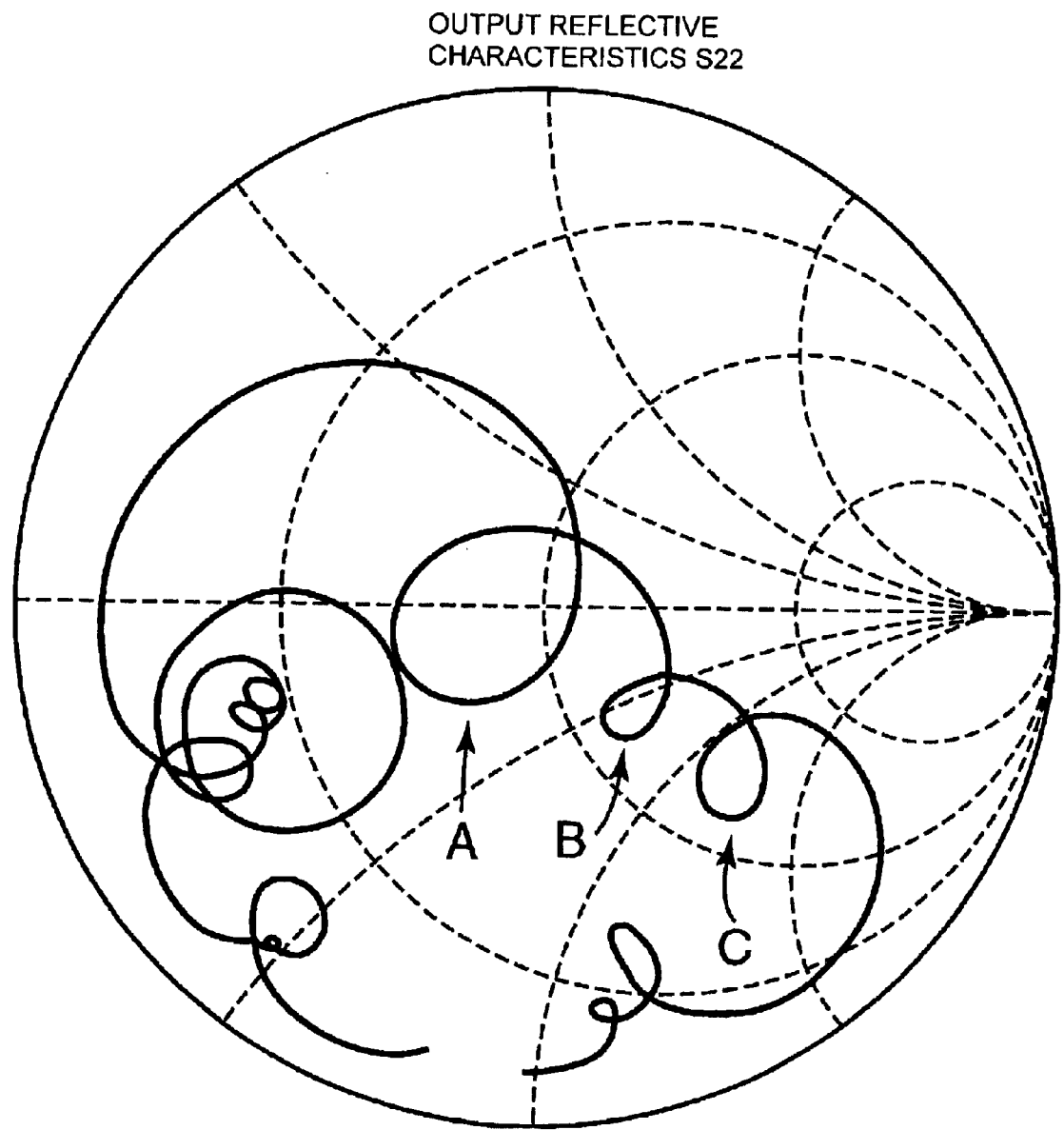
FIG. 15 plots, in the Smith chart, the reflective characteristics S22 of the surface acoustic wave filter shown in FIG. 13.
Figure 16:
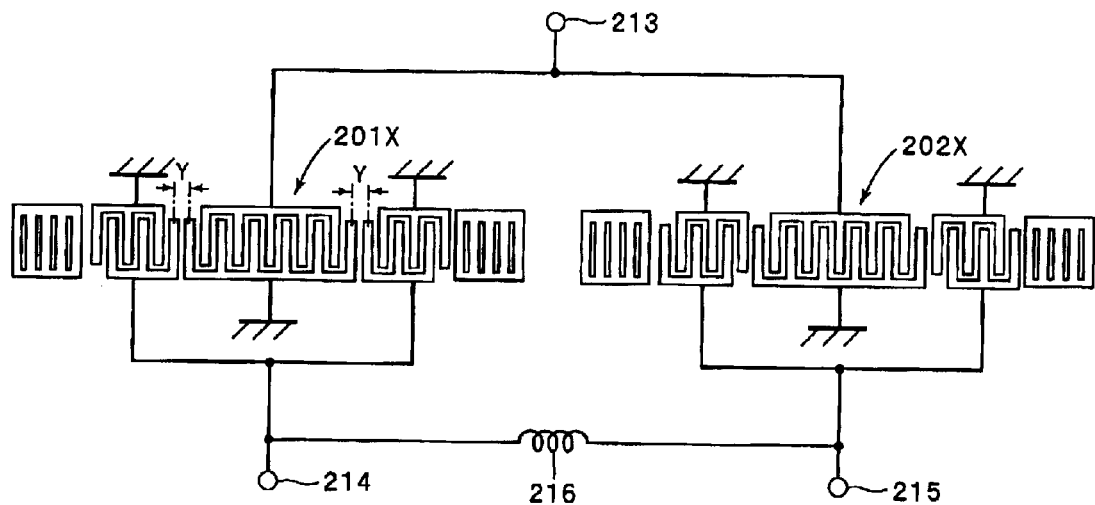
FIG. 16 is a plan view showing the electrode structure of a surface acoustic wave filter which has three resonance modes without a narrow-pitched electrode finger portion.

In view of the results shown in FIGS. 9 and 10, the inventors of the present invention have studied the manner of connection of the surface acoustic wave resonators to the longitudinally coupled resonator type surface acoustic wave filter sections 201 and 202. Referring to FIG. 13, surface acoustic wave resonators 226 and 227 are respectively connected to the inputs of the longitudinally coupled resonator type surface acoustic wave filter sections 201 and 202. FIGS. 14 and 15 are Smith charts respectively showing reflective characteristics S11 and S22 of the filter.

As understood from FIGS. 14 and 15, the resonance mode C appears in the reflective characteristics S22 when the surface acoustic wave resonators are connected to the input of the filter. The resonance mode C is not recognized in the reflective characteristics S11 since the resonance mode C is spaced from the impedance matching point. The VSWR is not sufficiently improved in comparison with the first preferred embodiment of the present invention.

The first preferred embodiment efficiently improves the VSWR by connecting the surface acoustic wave resonator to the input terminal or the output terminal of each of the longitudinally coupled resonator type surface acoustic wave filter sections 201 and 202, whichever has a greater number of IDTs connected thereto.

In accordance with preferred embodiments of the present invention, each of the longitudinally coupled resonator type surface acoustic wave filter sections 201 and 202 include narrow-pitched electrode finger portions. The insertion loss within the passband is thus greatly reduced, and the present invention has another pronounced effect as discussed below.

To use the above-referenced resonance modes without the narrow-pitched electrode fingers, the spacing Y between the adjacent IDTs having no narrow-pitched electrode portion in each of the longitudinally coupled resonator type surface acoustic wave filter sections 201X and 202X must be placed within a range of $(0.25+0.5n)\lambda I$ to $(0.30+0.5n)\lambda I$ (n=0, 1, 2, . . . ). In this arrangement, a large discontinuity point occurs in the surface acoustic wave propagation path, and the insertion loss within the passband increases. In particular, the resonance mode C is adversely affected by the discontinuity in the propagation path, because the resonance mode C has a peak in a current distribution in an area where the IDTs are adjacent to each other.

Figure 17:
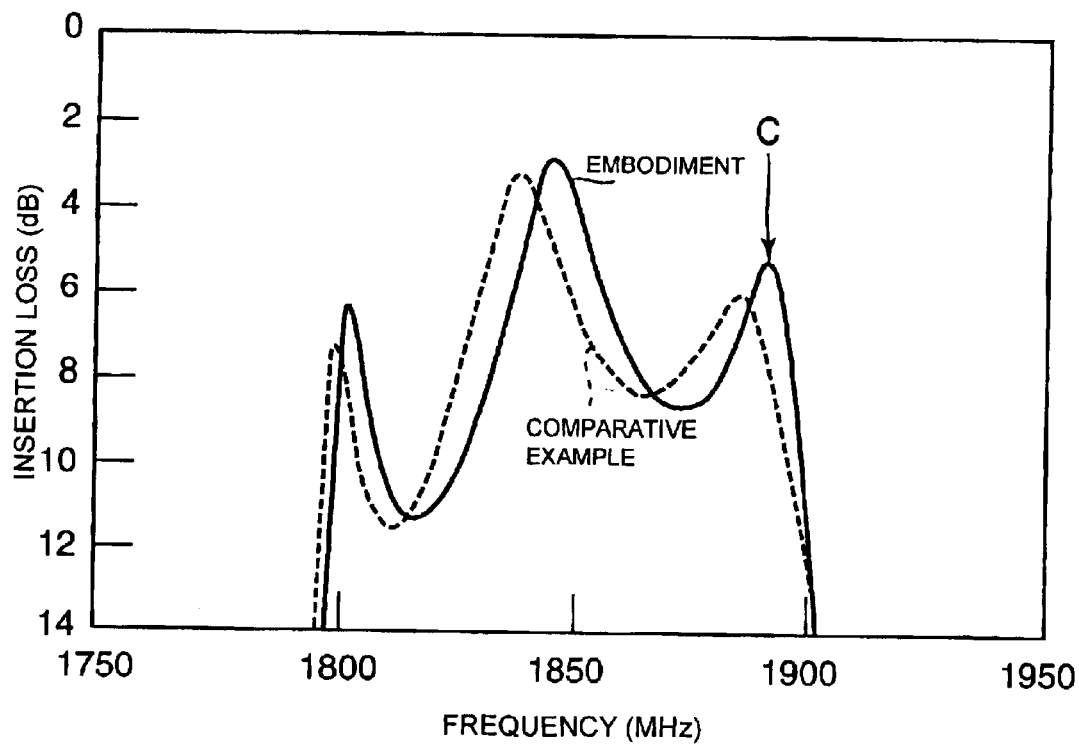
FIG. 17 plots attenuation-frequency characteristics, explaining a resonance mode of a surface acoustic wave filter which has an spacing Y of $0.30\lambda I$ between IDTs without narrow-pitched electrode finger portion.

FIG. 17 plots, in broken line, the resonance modes in the attenuation-frequency characteristics of the surface acoustic wave filter which has no narrow-pitched electrode fingers when the spacing Y between the adjacent IDTs is about $0.30\lambda I$. In this arrangement, each of the IDTs includes electrode fingers at a pitch equal to a pitch of the remaining portions, instead of the narrow-pitched electrode finger portion, and includes the same total number of electrode fingers as the first preferred embodiment of the present invention.

FIG. 17 also plots the characteristics of the surface acoustic wave filter 200 of the first preferred embodiment in solid line together with the characteristics of the longitudinally coupled resonator type surface acoustic wave filter of the comparative example identified in broken line.

As understood from FIG. 17, the filter with the spacing between the adjacent IDTs that is about $0.30\lambda I$ has more insertion loss in the resonance mode C and a decreased quality factor Q as compared with the filter of the first preferred embodiment. A reduced quality factor Q distorts the left edge, namely, the high-frequency edge of the passband response, even if the resonance mode C is impedance matched. This increases the insertion loss. To avoid increasing the insertion loss, the passband width must be increased. If the passband width is increased, the SWR characteristics are degraded. Thus, the advantages of the present invention are not sufficiently exploited. To provide the advantages of the present invention, the longitudinally coupled resonator type surface acoustic wave filter sections 201 and 202 preferably include the narrow-pitched electrode finger portion.

As described above, the longitudinally coupled resonator type surface acoustic wave filter 200 includes three IDTs 203 through 205 and three IDTs 208 through 210 arranged in the direction of propagation of the surface acoustic wave on the piezoelectric substrate, and each of the longitudinally coupled resonator type surface acoustic wave filter sections 201 and 202 includes the narrow-pitched electrode finger portion. The surface acoustic wave resonators 221 and 222 are respectively connected to the outputs of the longitudinally coupled resonator type surface acoustic wave filter sections 201 and 202, namely, the terminals having a greater number of IDTs connected thereto. The resonance frequency of the surface acoustic wave resonators 221 and 222 falls within the passband of the longitudinally coupled resonator type surface acoustic wave filter sections 201 and 202, and the antiresonance frequency of the surface acoustic wave resonators 221 and 222 is outside of the passband in the vicinity of the high frequency side of the passband. The use of the surface acoustic wave resonator caused the impedance of the resonance mode C to be within the highest frequency region of the surface acoustic wave filter 200 close to the impedance matching point. As a result, the VSWR is greatly improved without significantly degrading the transmission characteristic in the passband.

FIGS. 18 through 22 are plan views diagrammatically showing the electrode structures of surface acoustic filters in accordance with modifications of the first preferred embodiment of the present invention.

Figure 18:
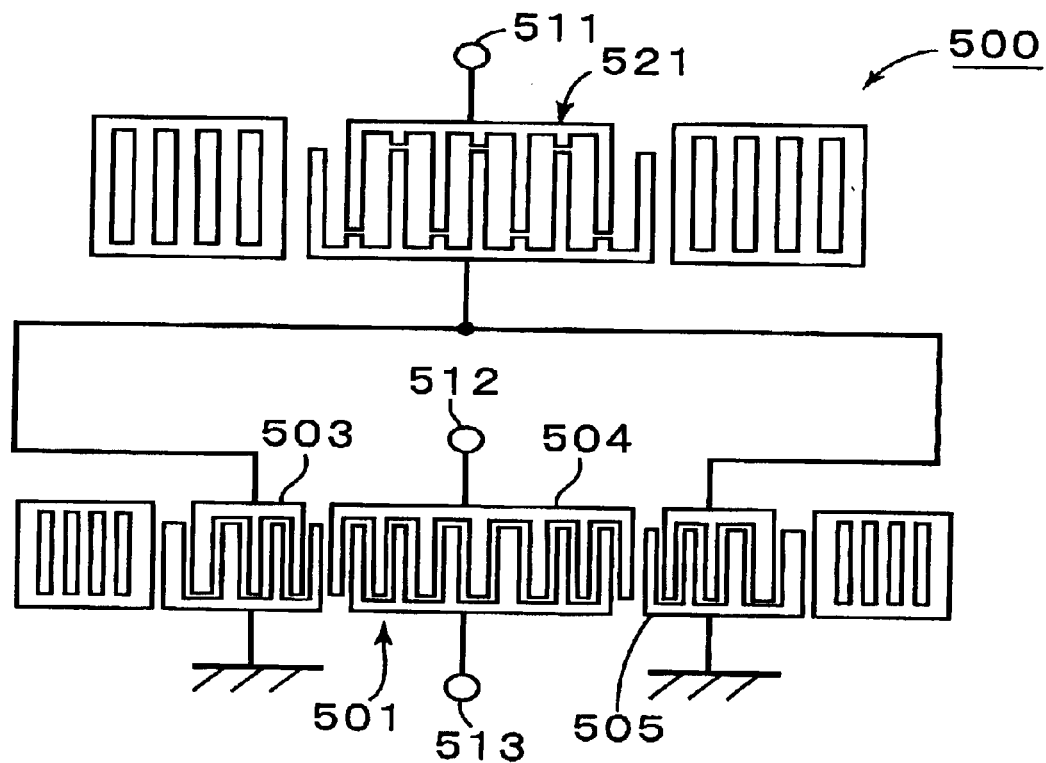
FIG. 18 is a plan view diagrammatically showing the electrode structure of a surface acoustic wave filter in accordance with a modification of the first preferred embodiment of the present invention.

A surface acoustic wave filter 500 shown in FIG. 18 is one modification of the first preferred embodiment having an unbalance-balance converting function. Here, a longitudinally coupled resonator type surface acoustic wave filter section 501 includes three IDTs 503 through 505. A surface acoustic wave resonator 521 is serially connected to IDTs 503 and 505, and is also connected to an unbalanced signal terminal 511. A pair of balanced signal terminals 512 and 513 are connected to both ends of the center IDT 504.

Figure 19:
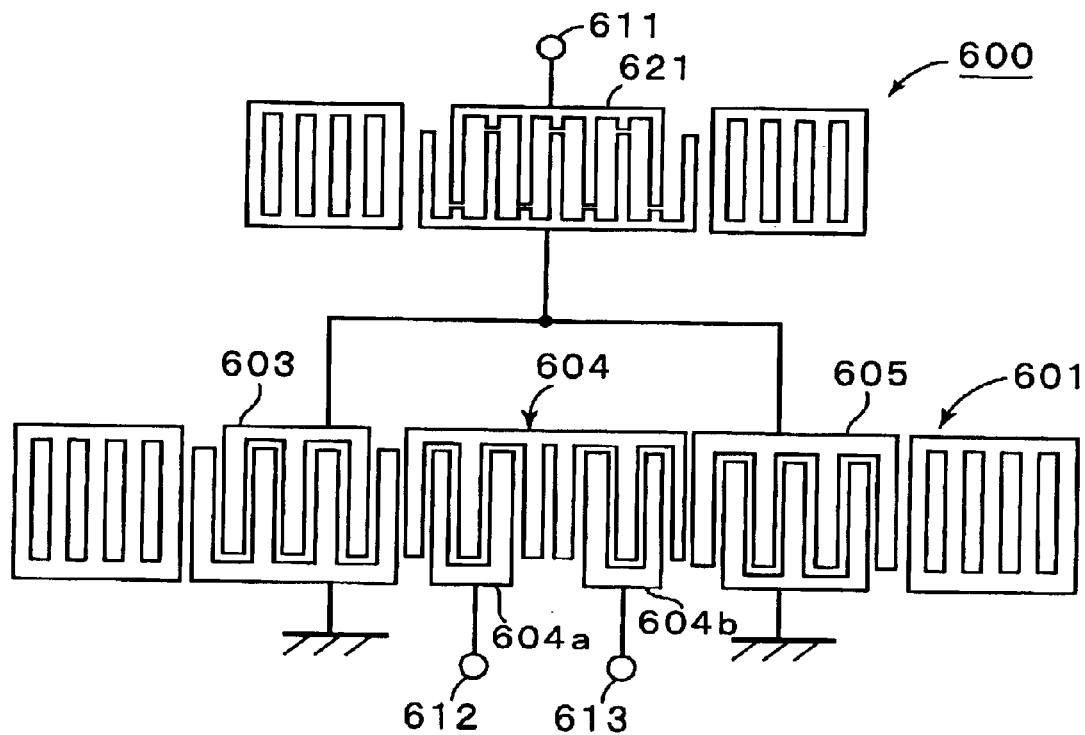
FIG. 19 is a plan view diagrammatically showing the electrode structure of a surface acoustic wave filter in accordance with a modification of the first preferred embodiment of the present invention.

A surface acoustic wave filter 600 shown in FIG. 19 includes a longitudinally coupled resonator type surface acoustic wave filter section 601 including three IDTs. The center IDT 604 of the three IDTs 603 through 605 includes two separate IDT sections 604a and 604b arranged in the direction of propagation of the surface acoustic wave. An unbalanced signal terminal 611 is connected to the IDTs 603 and 605 through a surface acoustic wave resonator 621. A pair of balanced signal terminals are respectively connected to the IDT sections 604a and 604b of the IDT 604.

Figure 20:
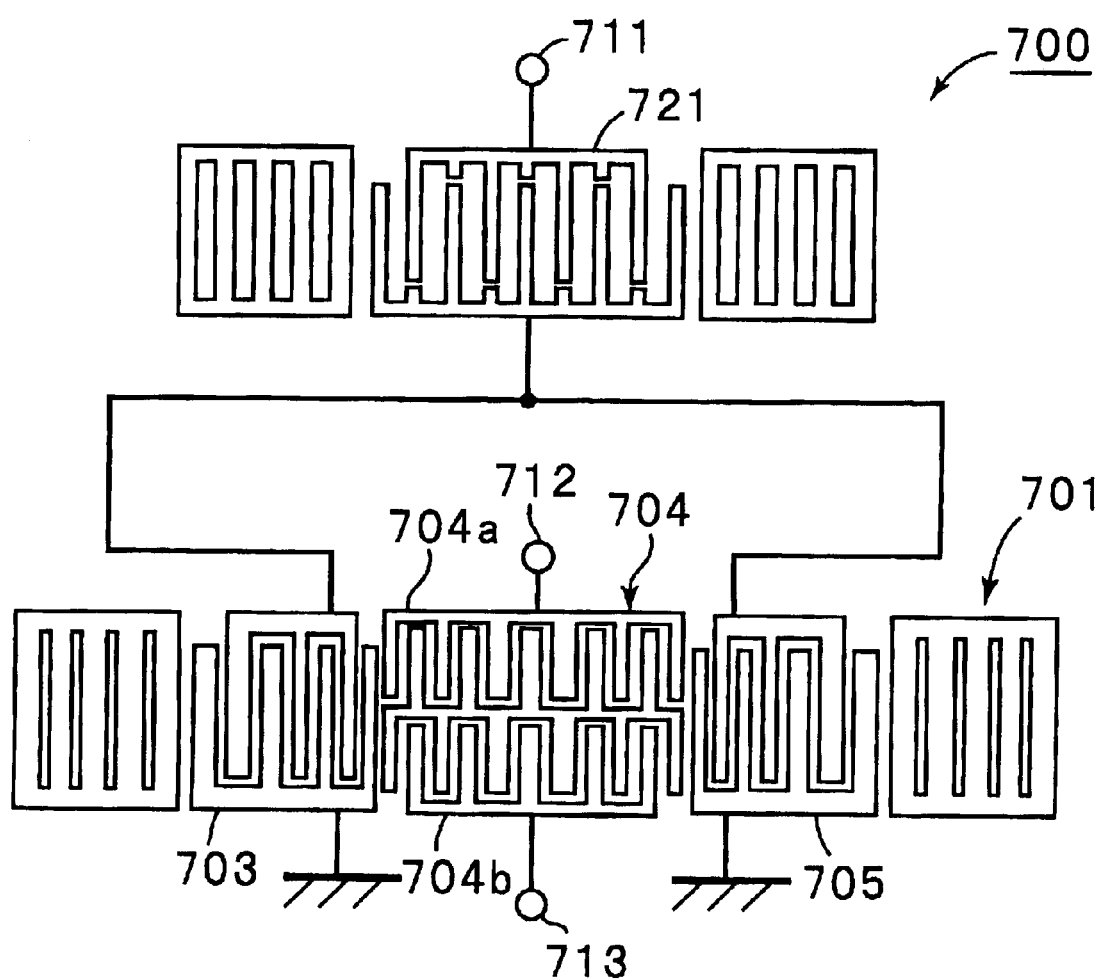
FIG. 20 is a plan view diagrammatically showing the electrode structure of a surface acoustic wave filter in accordance with a modification of the first preferred embodiment of the present invention.

Unlike the surface acoustic wave filter 600 shown in FIG. 19, a surface acoustic wave filter 700 shown in FIG. 20 includes a longitudinally coupled resonator type surface acoustic wave filter section 701 which includes a center IDT 704 that includes two separate IDTs 704a and 704b split along a line transversely extending across the electrode fingers. A pair of balanced signal terminals 712 and 713 are respectively connected to the IDT sections 704a and 704b. Outside IDTs 703 and 705, which are commonly connected, are connected to an unbalanced signal terminal 711 through a surface acoustic wave resonator 721.

Figure 21:
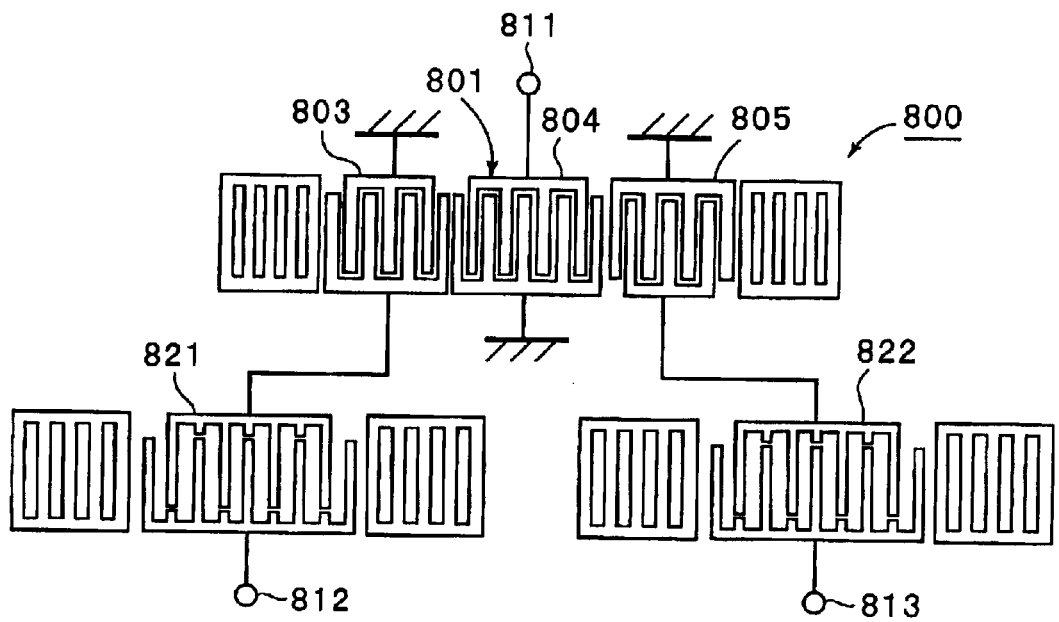
FIG. 21 is a plan view diagrammatically showing the electrode structure of a surface acoustic wave filter in accordance with a modification of the first preferred embodiment of the present invention.
Figure 22:
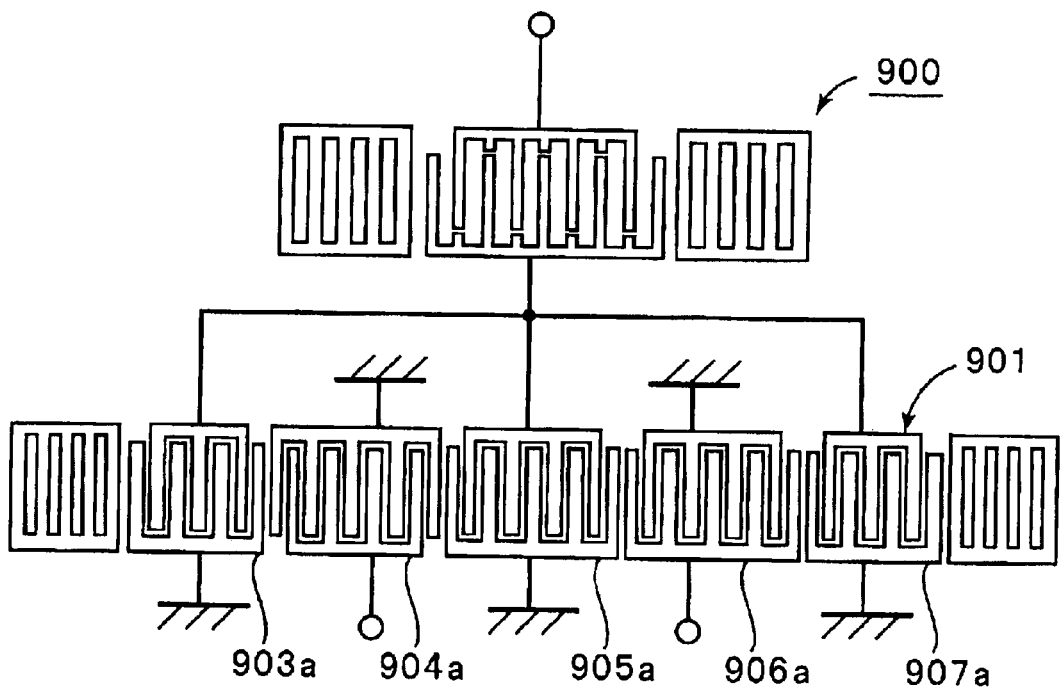
FIG. 22 is a plan view diagrammatically showing the electrode structure of a surface acoustic wave filter in accordance with a modification of the first preferred embodiment of the present invention.

In a surface acoustic wave filter 800 shown in FIG. 21, an unbalanced signal terminal 811 is connected to a center IDT 804 of a longitudinally coupled resonator type surface acoustic wave filter section 801. IDTs 803 and 805 on both sides of the center IDT 804 are respectively connected to balanced signal terminals 812 and 813 through surface acoustic wave resonators 821 and 822. The IDT 803 and IDT 805 are aligned to be opposite in polarity from each other.

The surface acoustic wave filter 800 shown in FIG. 21 includes the three IDTs 803 through 805. In an alternative arrangement, a surface acoustic wave filter 900 of a modification of the first preferred embodiment shown in FIG. 22 includes a longitudinally coupled resonator type surface acoustic wave filter section 901 including five IDTs 903a–907a.

Figure 23:
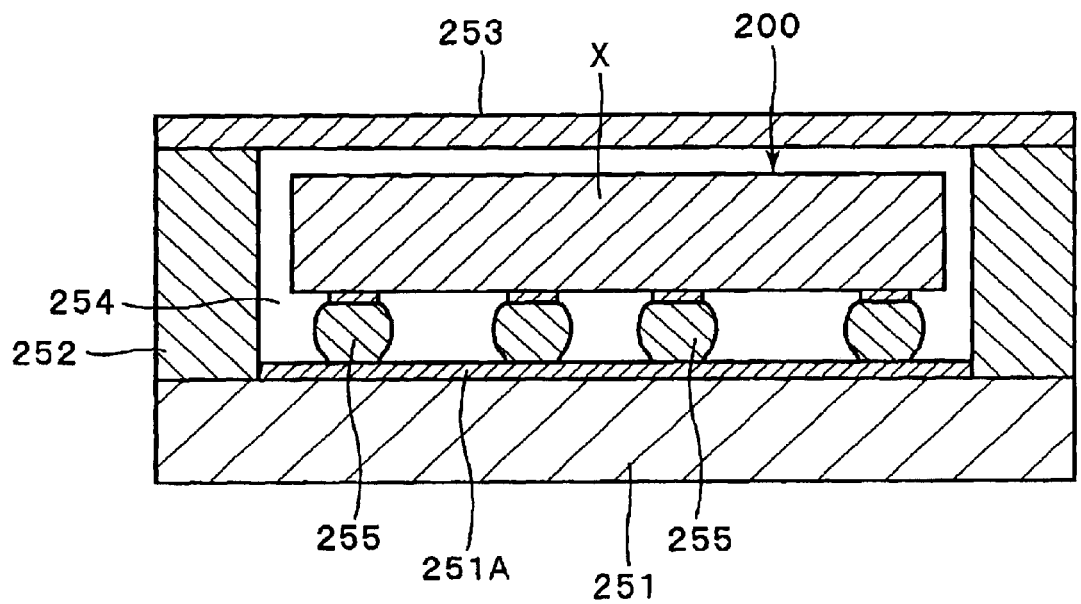
FIG. 23 is a cross-sectional view diagrammatically showing the structure of the surface acoustic wave filter housed in a package.

A variety of package structures may be used when the longitudinally coupled resonator type surface acoustic wave filter is packaged. For example, a package, which includes a bottom plate 251, a substantially circular wall 252 secured onto the bottom plate 251, and a planar cap member 253 for closing the top opening of the substantially circular wall 252 as shown in FIG. 23 may be used. The longitudinally coupled resonator type surface acoustic wave filter provided on a piezoelectric substrate A is secured on the bottom plate 251 within the spacing 254 in the package using a flip-chip technique. As diagrammatically shown in FIG. 23, a variety of various electrodes 251A to be connected to the surface acoustic wave filter 200 are provided on the top surface of the bottom plate 251. The surface acoustic wave filter 200 is mechanically and electrically connected to the bottom plate 251 using bumps 255 with the surface of the piezoelectric substrate X having the longitudinally coupled resonator type surface acoustic wave filter section 201 mounted facing downward.

It is not a requirement in the surface acoustic wave filter of the present invention that the electrodes provided on the piezoelectric substrate be electrically connected to the package using bump bonding. The electrodes provided on the piezoelectric substrate may be electrically connected to the package using wire bonding or through other suitable connection members. When the electrodes of the piezoelectric substrate are electrically connected to the package using the wire bonding, the impedance of the filter is likely to be inductive because of an impedance component of wires. Where the piezoelectric substrate is mounted onto the package using the flip-chip technique as shown in FIG. 23, the impedance is likely to be capacitive because inductance of wires does not exist. The longitudinally coupled resonator type surface acoustic wave filter 200 which is supported in the package using the flip-chip technique as shown in FIG. 23 provides more of the advantages of the present invention.

In the first preferred embodiment, the 40±5° Y-cut, X-propagating LiTaO$_3$ substrate is preferably used for the piezoelectric substrate A. Alternatively, another substrate such as a 64–72° Y-cut, X-propagating LiNbO$_3$ substrate, a 41° Y-cut, X-propagating LiNbO$_3$ substrate or other suitable substrate may be used.

Figure 24:
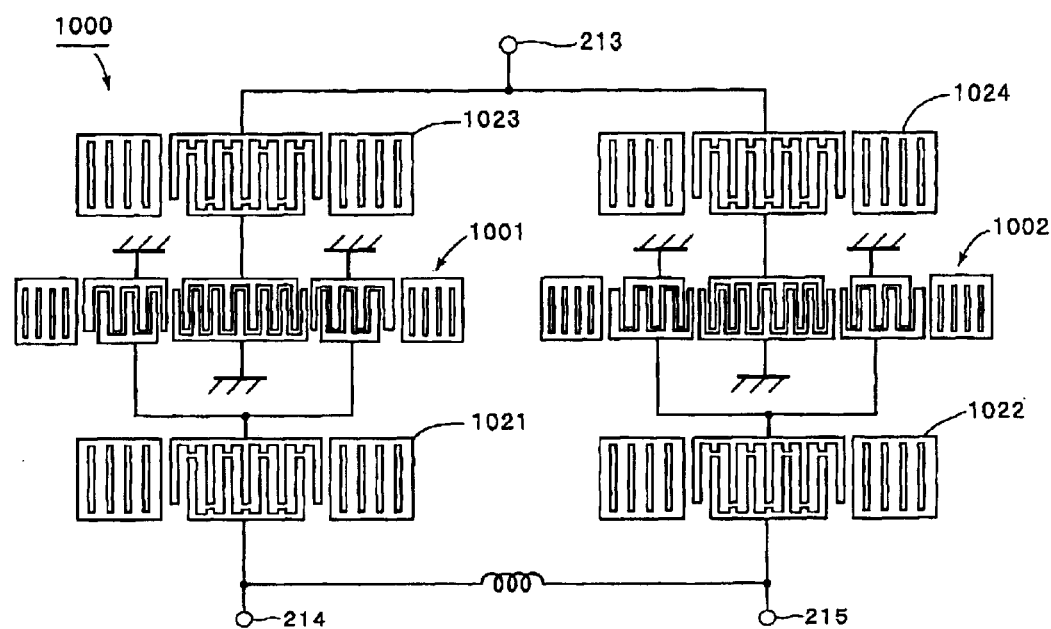
FIG. 24 is a plan view diagrammatically showing the electrode structure of the surface acoustic wave filter in accordance with a second preferred embodiment of the present invention.

FIG. 24 is a plan view diagrammatically showing the surface acoustic wave filter 1000 in accordance with a second preferred embodiment of the present invention. In addition to the structure of the first preferred embodiment, the surface acoustic wave filter of the second preferred embodiment includes a surface acoustic wave resonator 1023 connected between a longitudinally coupled resonator type surface acoustic wave filter sections 1001 and an unbalanced signal terminal 213 and a surface acoustic wave resonator 1024 connected between a longitudinally coupled resonator type surface acoustic wave filter section 1002 and the unbalanced signal terminal 213. The longitudinally coupled resonator type surface acoustic wave filter sections 1001 and 1002 are substantially identical in design to the longitudinally coupled resonator type surface acoustic wave filter sections 201 and 202 except for a slight difference in finger pitch in the narrow-pitched electrode finger portion. Surface acoustic wave resonators 1021 through 1024 are preferably substantially identical in design to the surface acoustic wave resonators 221 and 222.

Figure 25:
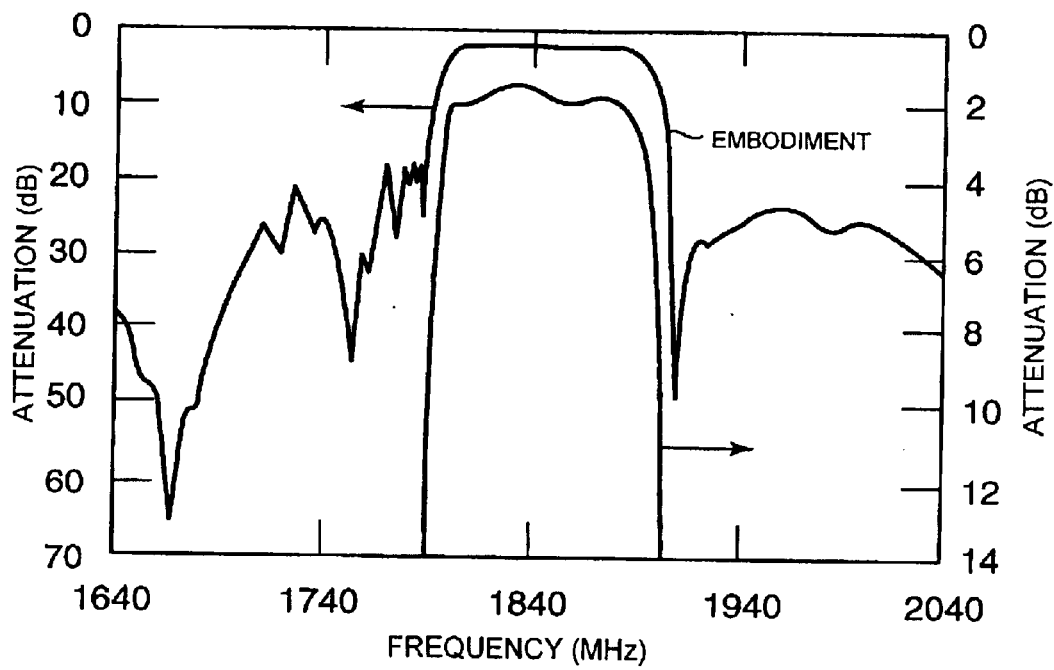
FIG. 25 plots transmission characteristics of the surface acoustic wave filter of the second preferred embodiment of the present invention.
Figure 26:
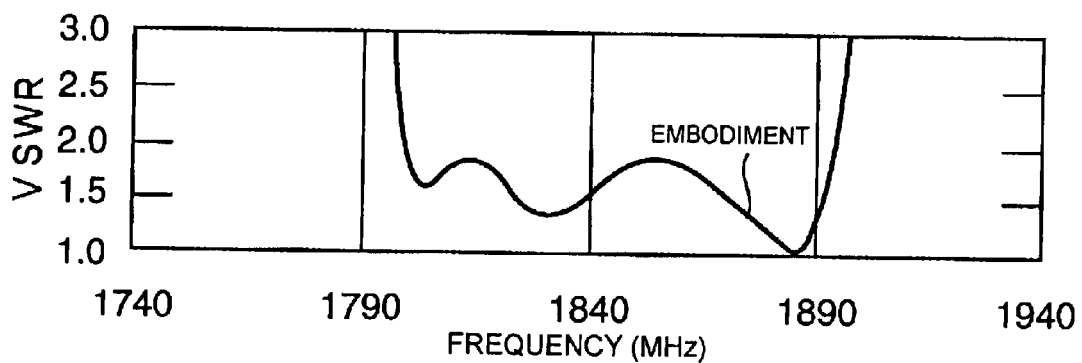
FIG. 26 plots input VSWR characteristics of the surface acoustic wave filter of the second preferred embodiment of the present invention.
Figure 27:
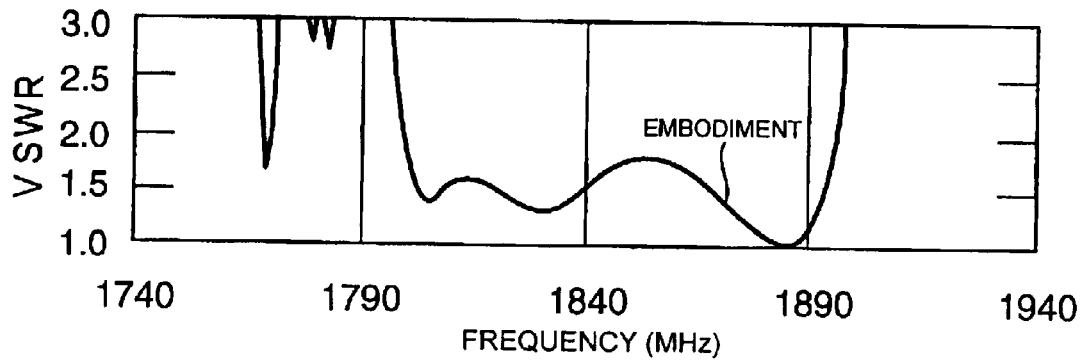
FIG. 27 plots output VSWR characteristics of the surface acoustic wave filter of the second preferred embodiment of the present invention.

FIG. 25 plots the transmission characteristics of the surface acoustic wave filter 1000 of the second preferred embodiment of the present invention. FIG. 26 plots the VSWR characteristics of the surface acoustic wave filter 1000 at the input thereof (the unbalanced signal terminal 213), and FIG. 27 plots the VSWR characteristics of the surface acoustic wave filter 1000 at the output thereof (the balanced signal terminals 214 and 215).

The surface acoustic wave filter 1000 shown in FIG. 24 has improved VSWR characteristics as compared to the first preferred embodiment without degrading the passband characteristics thereof.

Figure 28:
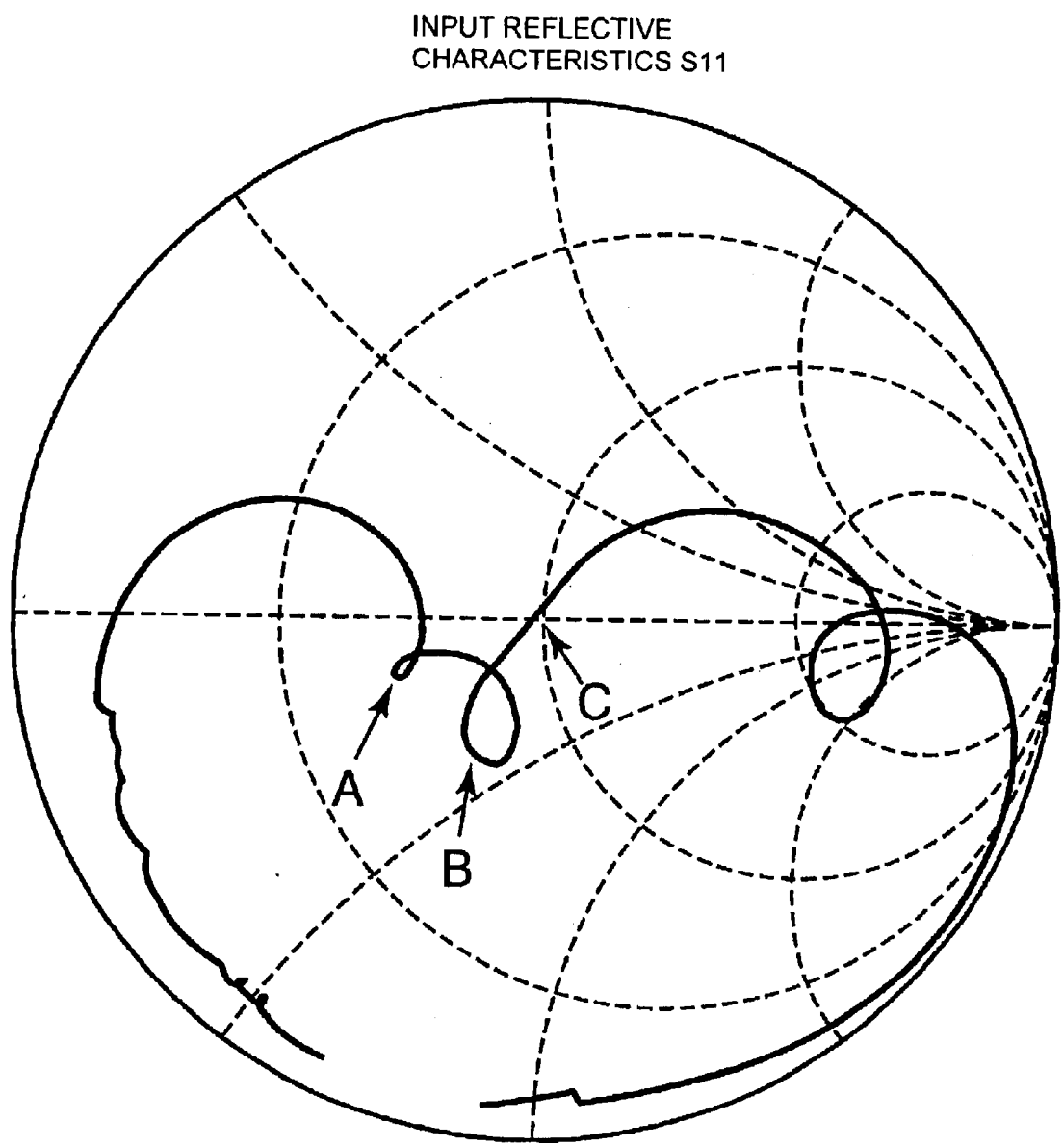
FIG. 28 plots, in the Smith chart, reflective characteristics S11 at the input of the surface acoustic wave filter of the second preferred embodiment of the present invention.
Figure 29:
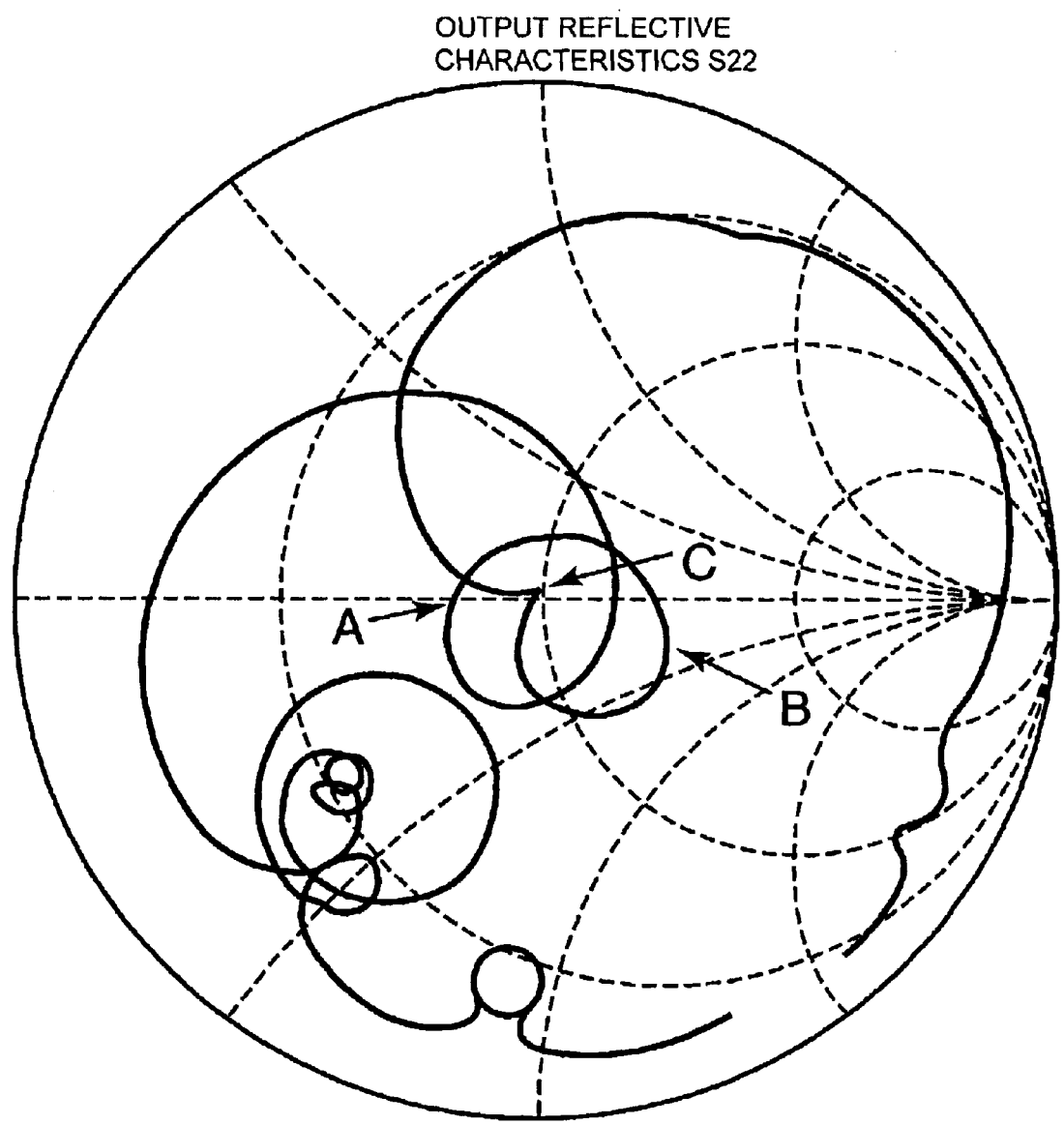
FIG. 29 plots, in the Smith chart, reflective characteristics S22 at the output of the surface acoustic wave filter of the second preferred embodiment of the present invention.

FIG. 28 plots, in the Smith chart, reflective characteristics S11 at the input of the surface acoustic wave filter 1000, and FIG. 29 plots, in the Smith chart, reflective characteristics S22 at the output of the surface acoustic wave filter 1000. As understood from FIGS. 28 and 29, the resonance mode C is closer to the impedance matching point than in the first preferred embodiment. The second preferred embodiment has an improved VSWR characteristic as compared to the first preferred embodiment. With an increased number of serially connected surface acoustic wave resonators in addition to those in the first preferred embodiment, the second preferred embodiment suffers from a slight degradation in insertion loss within the passband. The second preferred embodiment is therefore more advantageous than the first preferred embodiment in the application of a filter in which the VSWR characteristic is more important than the insertion loss within the passband.

The longitudinally coupled resonator type surface acoustic wave filter 1000 of the second preferred embodiment includes the surface acoustic wave resonators 1023 and 1024 serially connected to the inputs of the longitudinally coupled resonator type surface acoustic wave filter sections, namely, the terminals to which a smaller number of IDTs is connected. The resonance frequency of the surface acoustic wave resonators falls within the passband of the longitudinally coupled resonator type surface acoustic wave filter sections 1001 and 1002, and the antiresonance frequency of the surface acoustic wave resonator falls outside of the passband in the vicinity of the high frequency region of the passband. The use of the surface acoustic wave resonators 1021 through 1024 produces the impedance of the resonance mode C in the high frequency region of the surface acoustic wave filter 1000 closer to the impedance matching point. The second preferred embodiment thus has an improved VSWR as compared to the first preferred embodiment.

FIGS. 30 through 35 are circuit diagrams showing modifications of the surface acoustic wave filter 1000 of the second preferred embodiment of the present invention.

Figure 30:
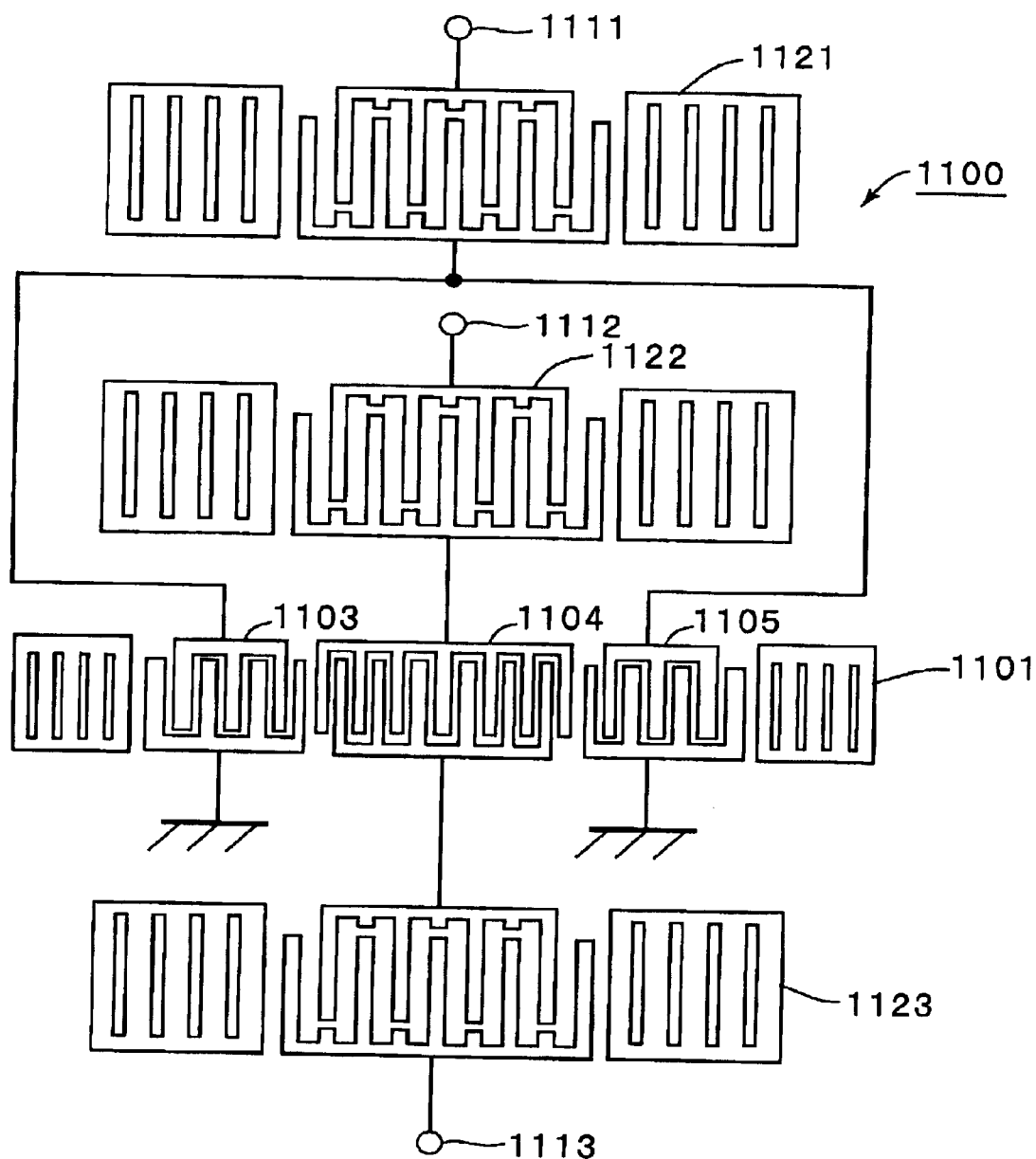
FIG. 30 is a plan view showing a modification of the surface acoustic wave filter of the second preferred embodiment of the present invention.

A surface acoustic wave filter 1100 shown in FIG. 30 is a modification of the surface acoustic wave filter 1000 having an unbalance-balance converting function. A longitudinally coupled resonator type surface acoustic wave filter section 1101 includes three IDTs 1103 through 1105. A surface acoustic wave resonator 1121 is serially connected to each of the IDTs 1103 and 1105, and is also connected to an unbalanced signal terminal 1111. A pair of balanced signal terminals 1112 and 1113 are respectively connected to both ends of the center IDT 1104 through surface acoustic wave resonators 1122 and 1123.

Figure 31:
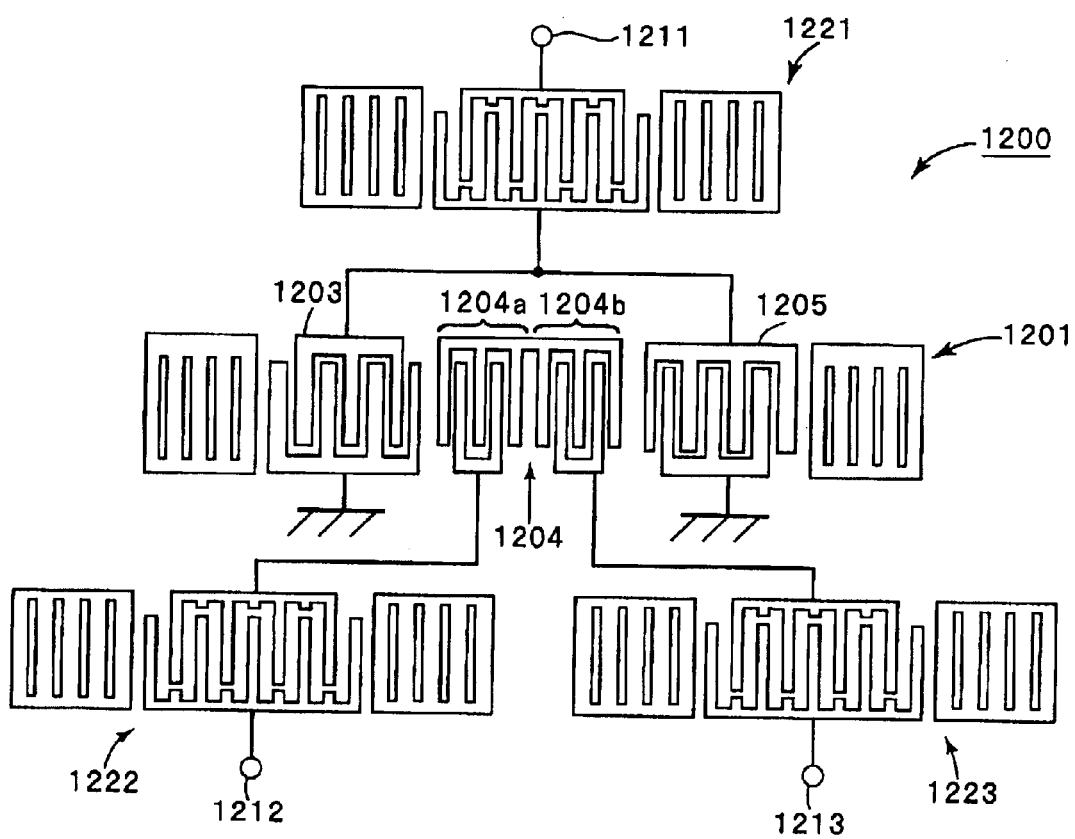
FIG. 31 is a plan view showing another modification of the surface acoustic wave filter of the second preferred embodiment of the present invention.

A surface acoustic wave filter 1200 shown in FIG. 31 includes a longitudinally coupled resonator type surface acoustic filter wave section 1201 having three IDTs. The center IDT 1204 of the IDTs 1203 through 1205 includes two separate IDT sections 1204a and 1204b arranged in the direction of propagation of the surface acoustic wave. An unbalanced signal terminal 1211 is connected to each of the IDTs 1203 and 1205 through a surface acoustic wave resonator 1221. A pair of balanced signal terminals 1212 and 1213 are respectively connected to the IDT sections 1204a and 1204b of the IDT 1204 through surface acoustic wave resonators 1222 and 1223.

Figure 32:
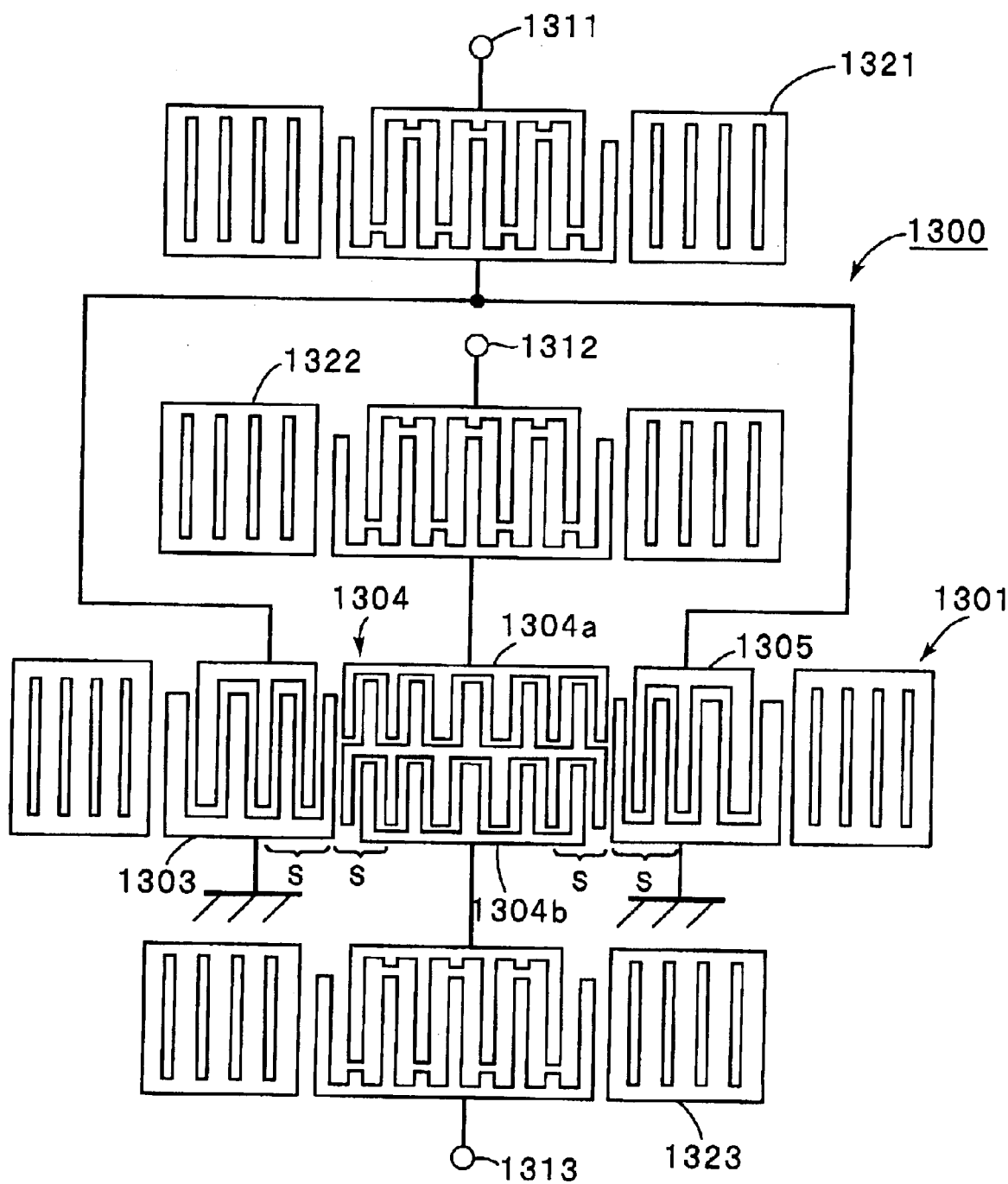
FIG. 32 is a plan view showing yet another modification of the surface acoustic wave filter of the second preferred embodiment of the present invention.

Unlike the surface acoustic wave filter 1200 shown in FIG. 31, a surface acoustic wave filter 1300 shown in FIG. 32 includes a longitudinally coupled resonator type surface acoustic wave filter section 1301 which includes a center IDT 1304 that is split into two IDTs 1304a and 1304b along a line transversely extending across the electrode fingers. A pair of balanced signal terminals 1312 and 1313 are respectively connected to the IDT sections 1304a and 1304b through surface acoustic wave resonators 1322 and 1323. Outside IDTs 1303 and 1305, which are commonly connected, are connected to an unbalanced signal terminal 1311 through a surface acoustic wave resonator 1321.

Figure 33:
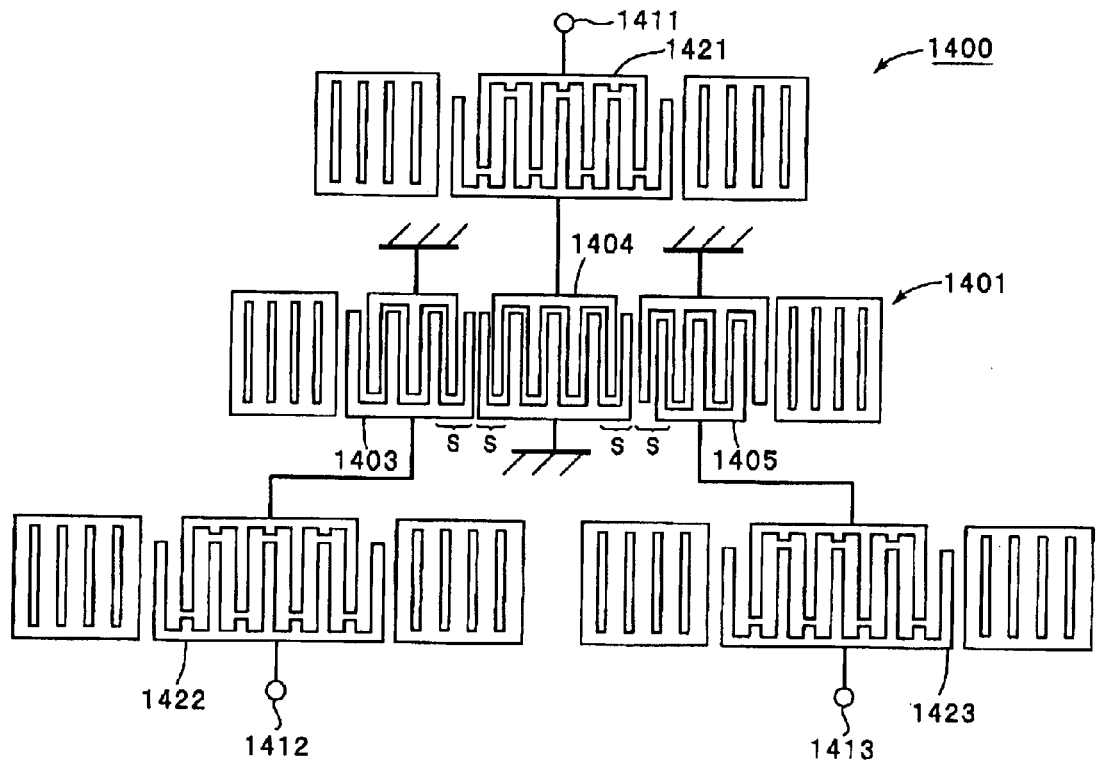
FIG. 33 is a plan view showing yet a further modification of the surface acoustic wave filter of the second preferred embodiment of the present invention.
Figure 34:
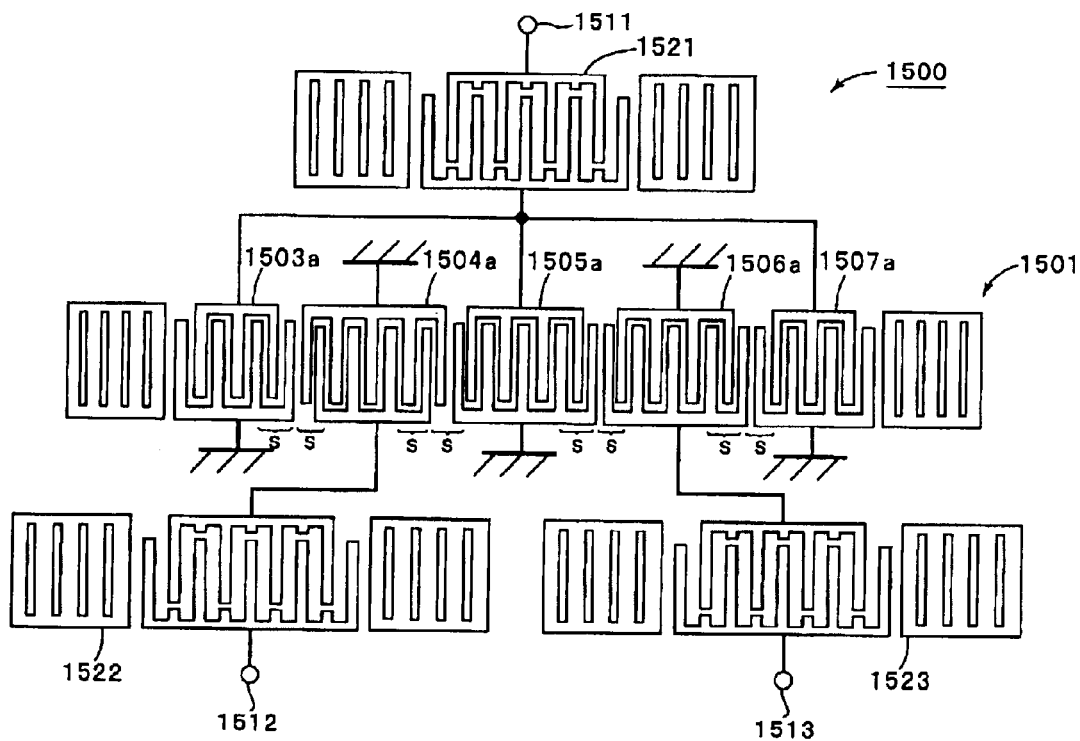
FIG. 34 is a plan view showing yet a further modification of the surface acoustic wave filter of the second preferred embodiment of the present invention.

In a surface acoustic wave filter 1400 shown in FIG. 33, an unbalanced signal terminal 1411 is connected to a center IDT 1404 of a longitudinally coupled resonator type surface acoustic wave filter section 1401. IDTs 1403 and 1405 on both sides of the center IDT 1404 are respectively connected to balanced signal terminals 1412 and 1413 through surface acoustic wave resonators 1422 and 1423. The IDT 1403 and IDT 1405 are aligned to be opposite in polarity from each other.

The surface acoustic wave filter 1400 shown in FIG. 33 includes the three IDTs 1403 through 1405. In an alternative arrangement, a surface acoustic wave filter 1500 of a modification of the first preferred embodiment shown in FIG. 34 includes a longitudinally coupled resonator type surface acoustic wave filter section 1501 including five IDTs 1503a–1507a.

Figure 35:
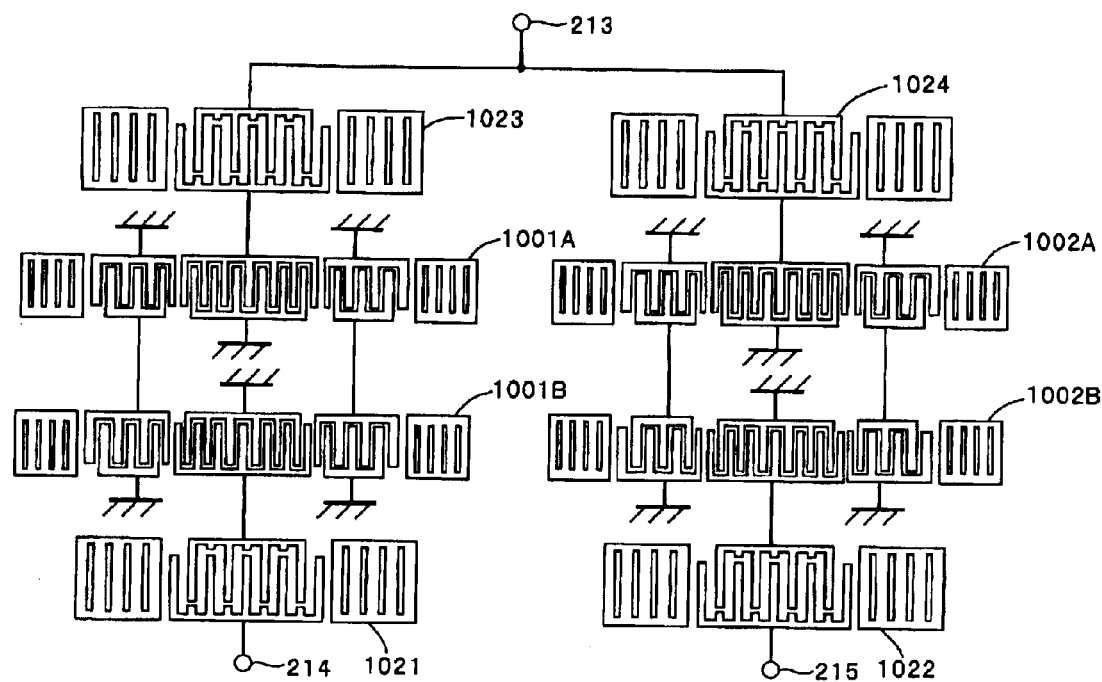
FIG. 35 is a plan view showing yet a further modification of the surface acoustic wave filter of the second preferred embodiment of the present invention.

A modification of the surface acoustic wave filter 1000 shown in FIG. 35 includes a longitudinally coupled resonator type surface acoustic wave filter section 1001 including a serial connection of a longitudinally coupled resonator type surface acoustic wave filter section 1001A and a longitudinally coupled resonator type surface acoustic wave filter section 1001B, and a longitudinally coupled resonator type surface acoustic wave filter section 1002 including a serial connection of a longitudinally coupled resonator type surface acoustic wave filter section 1002A and a longitudinally coupled resonator type surface acoustic wave filter section 1002B.

In the above-described preferred embodiments, a single surface acoustic wave resonator is connected to each of the input and output of the surface acoustic wave filter section. Alternatively, a plurality of surface acoustic wave resonators may be connected to each of the input and output of the surface acoustic wave filter section.

Figure 36:
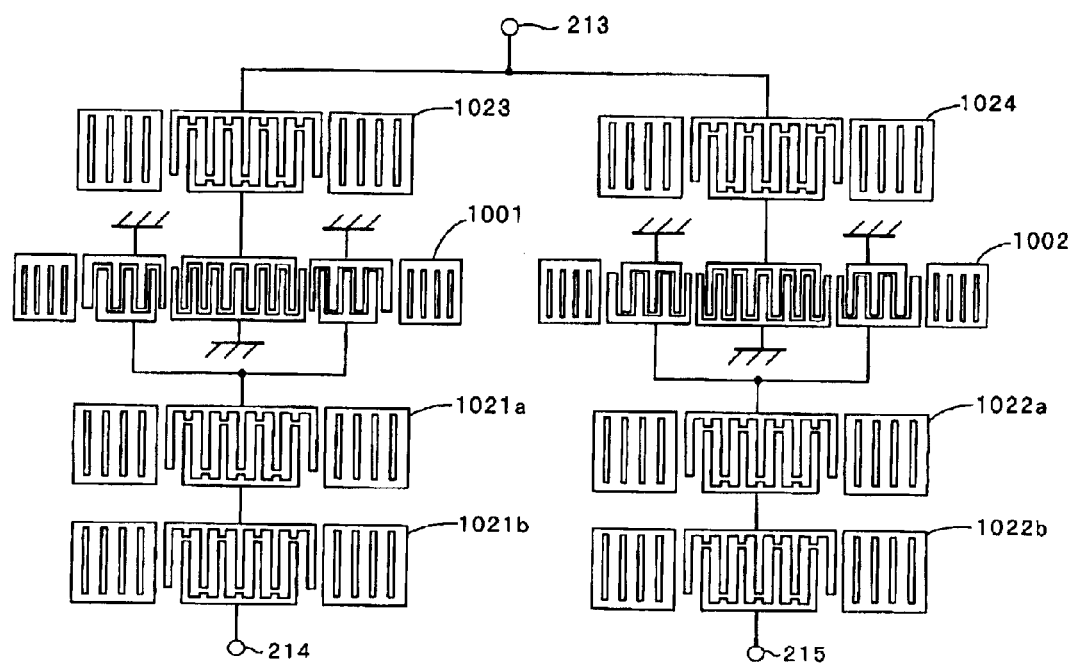
FIG. 36 is a plan view showing yet a further modification of the surface acoustic wave filter of the second preferred embodiment of the present invention.

Referring to FIG. 36, two surface acoustic wave resonators 1021a and 1021b are connected to the output of the surface acoustic wave filter section 1001, and two surface acoustic wave resonators 1022a and 1022b are connected to the output of the surface acoustic wave filter section 1002.

Figure 37:
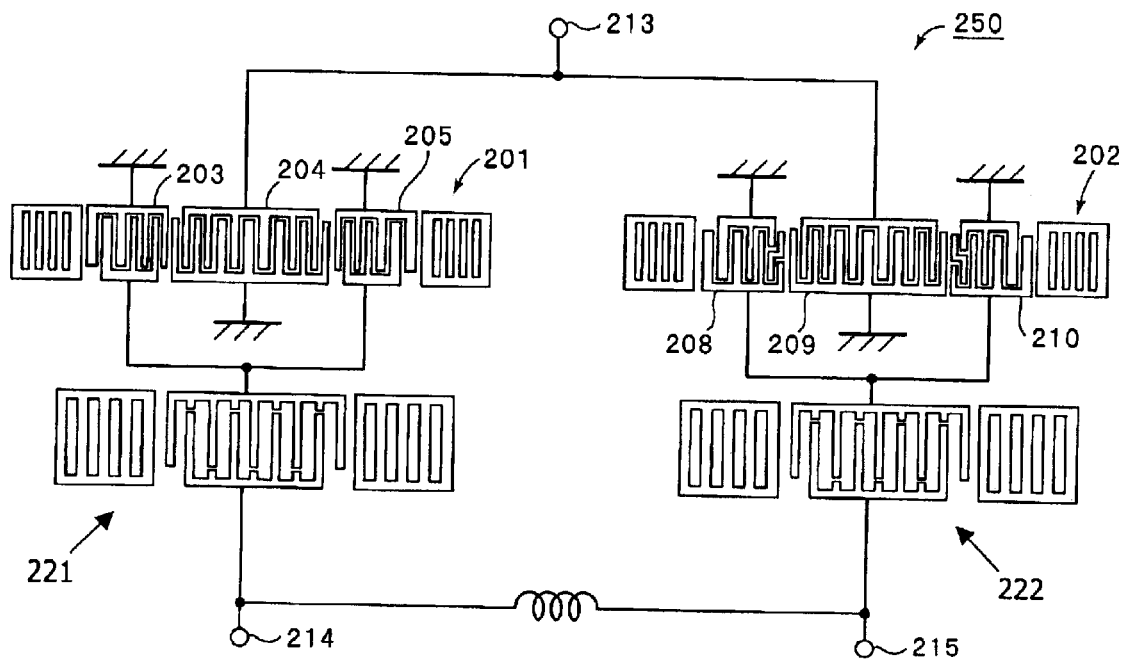
FIG. 37 is a plan view diagrammatically showing the electrode structure of the surface acoustic wave filter of a third preferred embodiment of the present invention.

FIG. 37 is a plan view diagrammatically showing the electrode structure of the surface acoustic wave filter 250 of a third preferred embodiment of the present invention. Electrode fingers are serially weighted in each of IDTs 208 and 210 in a longitudinally coupled resonator type surface acoustic wave filters 202. Specifically, each IDT includes several serially weighted electrode fingers in the area adjacent area to another IDT. The rest of the surface acoustic wave filter 250 is preferably substantially identical to the surface acoustic wave filter 200 of the first preferred embodiment.

Weighting of the electrode fingers improves the amplitude difference and phase difference, each of which is important in the surface acoustic wave filter having the unbalance-balance converting function. Specifically, the weighting compensates for a deviation in the amplitude characteristic and a deviation in a phase difference of 180° of the longitudinally coupled resonator type surface acoustic wave filter sections 201 and 202.

If the weighting is included in the adjacent portion of each IDT, the impedance of the resonance mode C shown in FIG. 7 increases. The VSWR in the passband may be degraded. However, since the propagation path of the surface acoustic wave is not discontinued, the quality factor Q of the resonance mode is not degraded. In the third preferred embodiment, the VSWR is improved as in the first preferred embodiment by setting the impedance at the resonance mode C close to the impedance matching point using the surface acoustic wave resonators 221 and 222.

Figure 38:
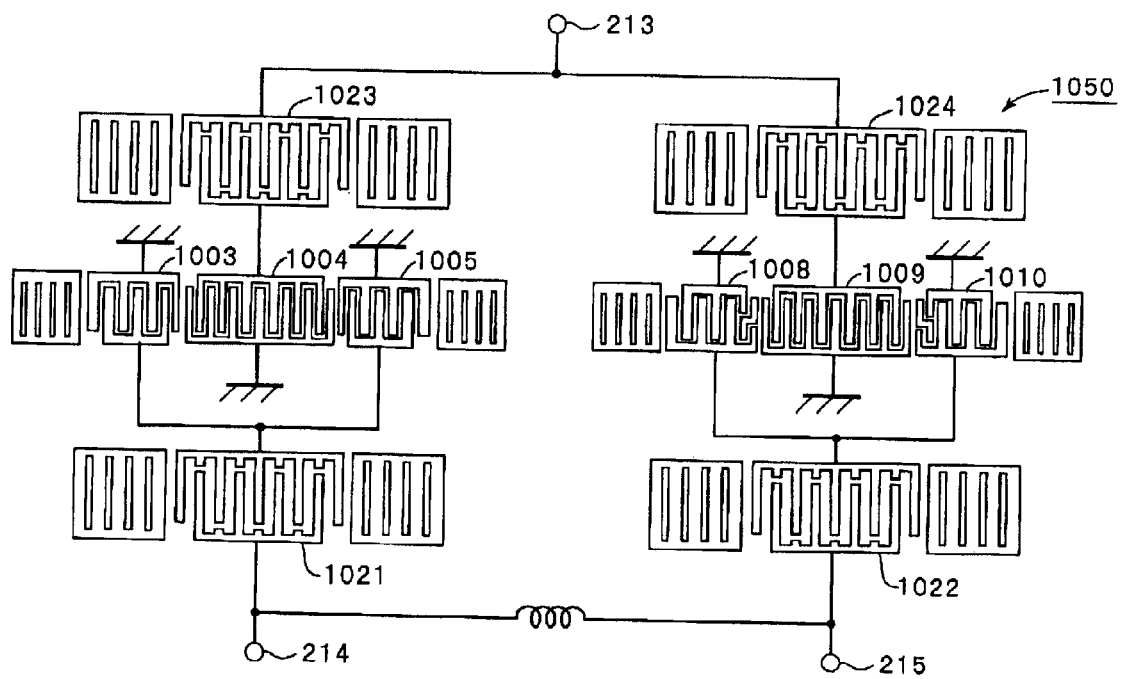
FIG. 38 is a plan view diagrammatically showing the electrode structure of a modification of the surface acoustic wave filter of the third preferred embodiment of the present invention.

FIG. 38 shows a surface acoustic wave filter 1050 which is produced by serially weighting the surface acoustic wave filter 1000 of the second preferred embodiment. The surface acoustic wave filter 1050 produces an impedance at the resonance mode C close to the impedance matching point using surface acoustic wave resonators 1021 through 1024, thereby improving the VSWR in the same manner as in the second preferred embodiment.

Referring to FIGS. 37 and 38, electrode fingers are serially weighted in the adjacent area of the IDTs 208 and 210, and electrode fingers are serially weighted in the adjacent area of the IDTs 1008 and 1010. Other weighing methods may be used. For example, the electrode fingers may be weighted by decimating the fingers, by varying the transverse width of the electrode finger, or by varying the duty factor of the electrode finger.

Figure 39:
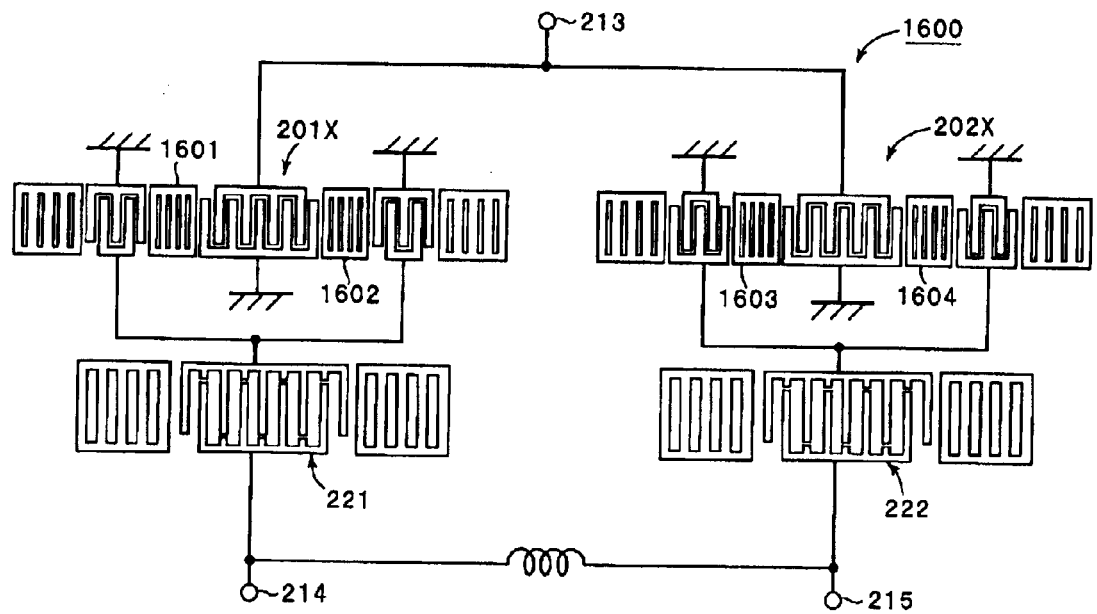
FIG. 39 is a plan view diagrammatically showing the electrode structure of the surface acoustic wave filter in accordance with a fourth preferred embodiment of the present invention.

FIG. 39 is a plan view diagrammatically showing the electrode structure of the surface acoustic wave filter 1600 in accordance with a fourth preferred embodiment of the present invention. In the surface acoustic wave filter 1600 of the fourth preferred embodiment, longitudinally coupled resonator type surface acoustic wave filter sections 201X and 202X do not include narrow-pitched electrode finger portions. Instead, reflectors 1601 through 1604, each having substantially the same electrode finger pitch as the narrow-pitched electrode portion, are provided. The rest of the fourth preferred embodiment is unchanged from the surface acoustic wave filter 200 of the first preferred embodiment.

Since each of the reflectors 1601 through 1604 is provided in the longitudinally coupled resonator type surface acoustic wave filter sections 201X and 202X in an area where IDTs are adjacent to each other, the impedance at the resonance mode C increases, and the VSWR within the passband may be degraded. However, since the propagation path of the surface acoustic wave is not discontinued in the fourth preferred embodiment, the quality factor Q of the resonance mode is not degraded. As in the first preferred embodiment, the VSWR is improved by providing the impedance at the resonance mode C close to the impedance matching point using the surface acoustic wave resonators 221 and 222.

Figure 40:
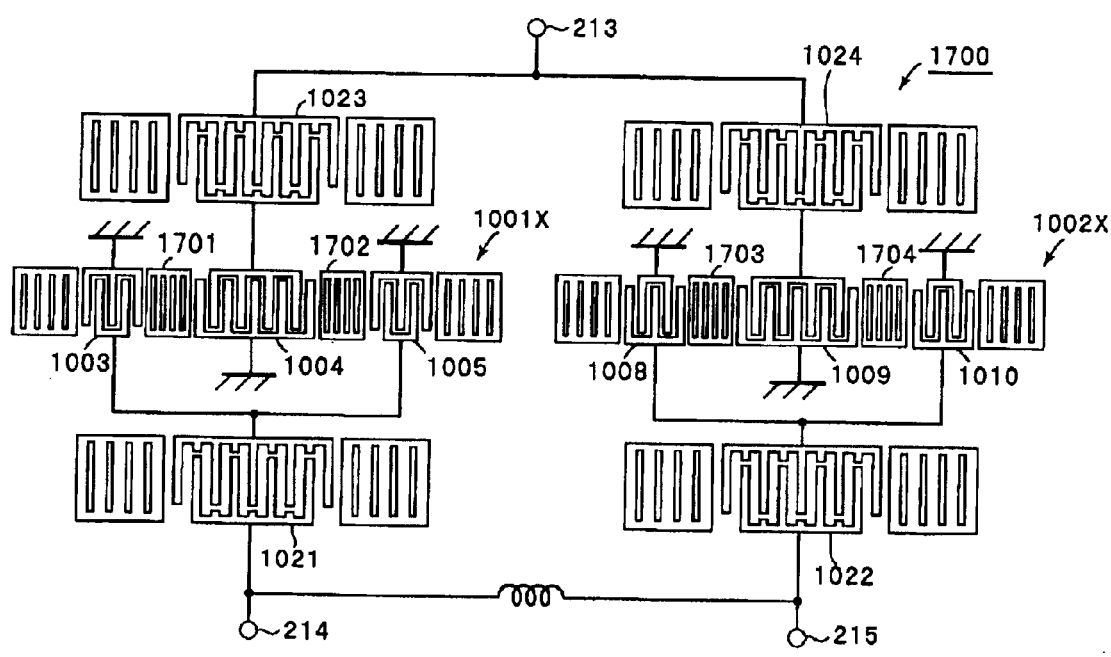
FIG. 40 is a plan view diagrammatically showing the electrode structure of a surface acoustic wave filter of an alternate preferred embodiment of the present invention.
Figure 41:
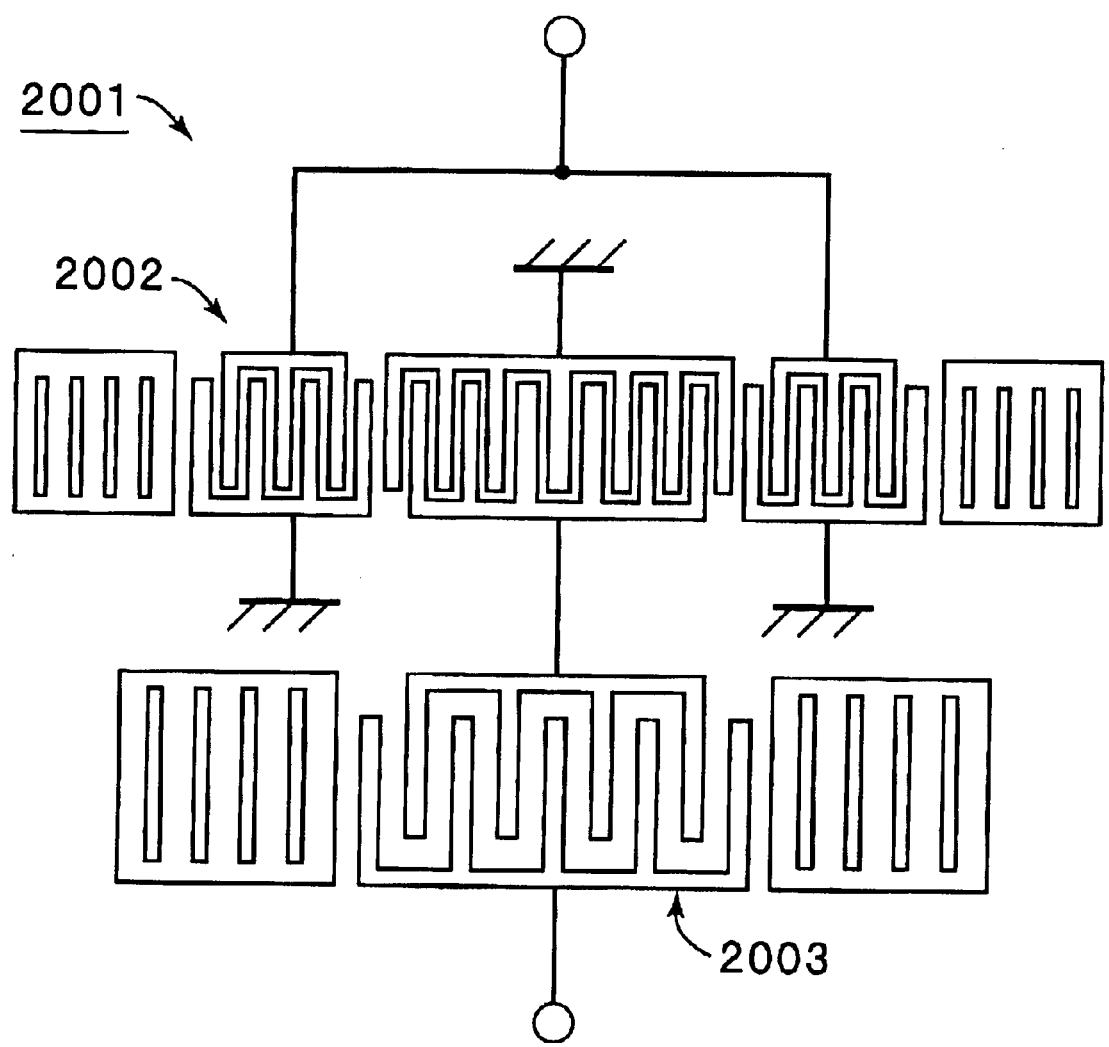
FIG. 41 is a plan view showing the electrode structure of a conventional surface acoustic wave filter device.

FIG. 40 is a plan view diagrammatically showing a surface acoustic wave filter 1700. The surface acoustic wave filter 1700 is produced by removing the narrow-pitched electrode finger portion from the surface acoustic wave filter 1000 of the second preferred embodiment, and by providing reflectors 1701 through 1704, each having an electrode finger pitch substantially equal to the electrode finger pitch of the narrow-pitched electrode finger portion. In the surface acoustic wave filter 1700, the use of surface acoustic wave resonators 1021 through 1024 produces an impedance at the resonance mode C close to the impedance matching point, thereby improving the VSWR in the same manner as in the second preferred embodiment.

In the surface acoustic wave filter, at least one surface acoustic wave resonator is serially connected between one of the input terminal and output terminal and the longitudinally coupled resonator type, threefold mode surface acoustic wave filter section including at least two IDTs, each having the narrow-pitched electrode finger portion. The impedance of the surface acoustic wave filter section at the resonance mode in the highest frequency region is capacitive. The resonance point of the surface acoustic wave resonator is within the passband of the filter, and the antiresonance point is in the vicinity of the highest frequency region of the passband. The impedance of the surface acoustic wave filter section at the resonance mode in the highest frequency region is close to the impedance matching point. With the impedance at the resonance mode in the highest frequency region set to be capacitive, impedance matching is performed using the added surface acoustic wave resonator. In other words, the resonance mode in the capacitive impedance is set to be close to the inductive impedance, by substantially matching the frequency band of the resonance mode in the high frequency region working in a capacitive impedance with the frequency band working in an inductive impedance of a trap circuit (the frequency band between the resonance point and the antiresonance point). Specifically, since the resonance mode in the highest frequency region is set to be close to inductive impedance, there is no need for narrowing the frequency separation between the three resonance modes. A wide band is thus easily achieved. Since the surface acoustic wave filter section having the narrow-pitched electrode finger portion is used, the insertion loss within the passband is reduced. Even with the wide band feature implemented, the VSWR characteristic is improved without degrading the transmission characteristic in the passband.

In the other surface acoustic wave filter, at least one surface acoustic wave resonator is serially connected between one of the input terminal and output terminal and the longitudinally coupled resonator type, threefold mode surface acoustic wave filter section including a resonator, provided between adjacent IDTs, having a plurality of electrode fingers at a electrode finger pitch narrower than each IDT.

The impedance of the surface acoustic wave filter section at the resonance mode, outside of the three resonance modes, in the highest frequency region becomes capacitive. The resonance point of the surface acoustic wave resonator is within the passband of the filter, and the antiresonance point is outside of the highest frequency region of the passband. The impedance of the surface acoustic wave filter section at the resonance mode in the highest frequency region is close to the impedance matching point. With the impedance at the resonance mode in the highest frequency region set to be capacitive, impedance matching is performed using the added surface acoustic wave resonator. In other words, the resonance mode in the capacitive impedance is set to be close to the inductive impedance by substantially matching the frequency bandwidth at the resonance mode in the highest frequency region with the frequency band of the trap circuit in the inductive impedance. Since the surface acoustic wave filter section having the narrow-pitched electrode finger portion is used, the insertion loss within the passband is reduced. Even with the wide band feature implemented, the VSWR characteristic is improved without degrading the transmission characteristic in the passband.

It should be understood that the foregoing description is only illustrative of the present invention. Various alternatives and modifications can be devised by those skilled in the art without departing from the present invention. Accordingly, the present invention is intended to embrace all such alternatives, modifications and variances which fall within the scope of the appended claims.

What is claimed is:

1. A surface acoustic wave filter comprising:
  a surface acoustic wave filter section including a piezoelectric substrate, at least two interdigital transducers arranged in a direction of propagation of a surface acoustic wave propagated on the piezoelectric substrate, wherein each of the at least two interdigital transducers includes a narrow-pitched electrode finger portion in which a pitch of electrode fingers in a portion of the interdigital transducer at an end of the interdigital transducer is narrower than that of electrode fingers in the remaining portions of the interdigital transducer at an area where the at least two interdigital transducers are adjacent to each other; and
  at least one surface acoustic wave resonator connected in series between the surface acoustic wave filter section and one of an input signal terminal and an output signal terminal; wherein
  the surface acoustic wave filter section is a threefold mode surface acoustic wave filter section of a longitudinally coupled resonator type, and an impedance of the surface acoustic wave filter section is capacitive in a resonance mode in the highest frequency region of three resonance modes thereof;
  the resonance point of the surface acoustic wave resonator is within a passband of the surface acoustic wave filter section, and the antiresonance point of the surface acoustic wave resonator is in the vicinity of the high frequency region of the passband of the surface acoustic wave filter section; and
  the surface acoustic wave resonator is arranged such that the impedance in the resonance mode positioned in the highest frequency region is close to an impedance matching point.

2. A surface acoustic wave filter according to claim 1, wherein at least a portion of at least one of the at least two interdigital transducers is weighted in an area where the at least two interdigital transducers are adjacent to each other in the surface acoustic wave filter section.

3. A surface acoustic wave filter according to claim 1, wherein the surface acoustic wave filter section includes an odd number of interdigital transducers, and the at least one surface acoustic wave resonator is connected between the surface acoustic wave filter section and one of the input signal terminal and the output signal terminal having a greater number of interdigital transducers connected thereto.

4. A surface acoustic wave filter according to claim 1, wherein the at least one surface acoustic wave resonator includes at least one surface acoustic wave resonator connected in series between the surface acoustic wave filter section and the input signal terminal, and at least one surface acoustic wave resonator connected in series between the surface acoustic wave filter section and the output signal terminal.

5. A surface acoustic wave filter according to claim 1, further comprising a plurality of surface acoustic wave resonators connected between the surface acoustic wave filter section and at least one of the input signal terminal and the output signal terminal.

6. A surface acoustic wave filter according to claim 1, wherein at least one of the input signal terminal and the output signal terminal includes a pair of balanced signal terminals.

7. A surface acoustic wave filter according to claim 1, wherein the input signal terminal and the output signal terminal function as an unbalance-balance converter with one of the input signal terminal and the output signal terminal being a balanced signal terminal, and the other of the input signal terminal and the output signal terminal being an unbalanced signal terminal.

8. A surface acoustic wave filter according to claim 7, wherein the surface acoustic wave filter section includes a first surface acoustic wave filter block and a second surface acoustic wave filter block, an output signal of the first surface acoustic wave filter block is different in phase by 180° from an output signal of the second surface acoustic wave filter block, first ends of the first and second surface acoustic wave filter blocks are connected together, functioning as an unbalanced signal terminal, and second ends of the first and second surface acoustic wave filter blocks function as balanced signal terminals.

9. A surface acoustic wave filter according to claim 7, wherein the surface acoustic wave filter section includes a single surface acoustic wave filter block, first terminals of the single surface acoustic wave filter block function as a pair of balanced signal terminals, and a second terminal of the single surface acoustic wave filter block functions as an unbalanced signal terminal.

10. A surface acoustic wave filter according to claim 8, wherein at least one of the at least two interdigital transducers of the surface acoustic wave filter section is split into first and second separate interdigital transducer sections split in a direction across the electrode fingers or in a direction of propagation of the surface acoustic wave.

11. A surface acoustic wave filter according to claim 1, wherein the at least one surface acoustic wave resonator and the surface acoustic wave filter section are disposed on a common piezoelectric substrate.

12. A surface acoustic wave filter according to claim 1, further comprising a case plate, wherein the piezoelectric substrate is mounted on the case plate in a manner such that a side of the piezoelectric substrate bearing the surface acoustic wave filter section and the at least one surface acoustic wave resonator faces the case plate.

13. A surface acoustic wave filter comprising:
   a surface acoustic wave filter section including a piezoelectric substrate, at least two interdigital transducers arranged in a direction of propagation of a surface acoustic wave propagated on the piezoelectric substrate, and a reflector arranged in an area where the at least two interdigital transducers are adjacent to each other, the reflector having a plurality of electrode fingers having an electrode finger pitch different from an electrode finger pitch of the at least two interdigital transducers; and
   at least one surface acoustic wave resonator connected in series between the surface acoustic wave filter section and one of an input signal terminal and an output signal terminal; wherein
      the surface acoustic wave filter section is a threefold mode surface acoustic wave filter section of a longitudinally coupled resonator type, and an impedance of the surface acoustic wave filter section is capacitive in a resonance mode in the highest frequency region outside of three resonance modes;
      the resonance point of the surface acoustic wave resonator is positioned within a passband of the surface acoustic wave filter section, and the antiresonance point of the surface acoustic wave resonator is positioned in the vicinity of the high frequency region of the passband of the surface acoustic wave filter section; and
      the at least one surface acoustic wave resonator is arranged such that the impedance in the resonance mode in the highest frequency region is close to an impedance matching point.

14. A surface acoustic wave filter according to claim 13, wherein the surface acoustic wave filter section includes an odd number of interdigital transducers, and the at least one surface acoustic wave resonator is connected between the surface acoustic wave filter section and one of the input signal terminal and the output signal terminal having a greater number of interdigital transducers connected thereto.

15. A surface acoustic wave filter according to claim 13, wherein the at least one surface acoustic wave resonator includes at least one surface acoustic wave resonator connected in series between the surface acoustic wave filter section and the input signal terminal, and at least one surface acoustic wave resonator connected in series between the surface acoustic wave filter section and the output signal terminal.

16. A surface acoustic wave filter according to claim 13, further comprising a plurality of surface acoustic wave resonators connected between the surface acoustic wave filter section and at least one of the input signal terminal and the output signal terminal.

17. A surface acoustic wave filter according to claim 13, wherein at least one of the input signal terminal and the output signal terminal includes a pair of balanced signal terminals.

18. A surface acoustic wave filter according to claim 13, wherein the input signal terminal and the output signal terminal function as an unbalance-balance converter with one of the input signal terminal and the output signal terminal being a balanced signal terminal, and the other of the input signal terminal and the output signal terminal being an unbalanced signal terminal.

19. A surface acoustic wave filter according to claim 18, wherein the surface acoustic wave filter section includes a first surface acoustic wave filter block and a second surface acoustic wave filter block, an output signal of the first surface acoustic wave filter block is different in phase by 180° from an output signal of the second surface acoustic wave filter block, first ends of the first and second surface acoustic wave filter blocks are connected together, functioning as an unbalanced signal terminal, and second ends of the first and second surface acoustic wave filter blocks function as balanced signal terminals.

20. A surface acoustic wave filter according to claim 18, wherein the surface acoustic wave filter section includes a single surface acoustic wave filter block, first terminals of the single surface acoustic wave filter block function as a pair of balanced signal terminals, and a second terminal of the single surface acoustic wave filter block functions as an unbalanced signal terminal.

21. A surface acoustic wave filter according to claim 19, wherein at least one interdigital transducer of the surface acoustic wave filter section is split into first and second separate interdigital transducer sections split in a direction across the electrode fingers or in a direction of propagation of a surface acoustic wave.

22. A surface acoustic wave filter according to claim 13, wherein the at least one surface acoustic wave resonator and the surface acoustic wave filter section are disposed on a common piezoelectric substrate.

23. A surface acoustic wave filter according to claim 13, further comprising a case plate, wherein the piezoelectric substrate is mounted on the case plate in a manner such that a side of the piezoelectric substrate bearing the surface acoustic wave filter section and the at least one surface acoustic wave resonator faces the case plate.

24. A communication apparatus comprising a surface acoustic wave filter comprising:
   a surface acoustic wave filter section including a piezoelectric substrate, at least two interdigital transducers arranged in a direction of propagation of a surface acoustic wave propagated on the piezoelectric substrate, wherein each of the at least two interdigital transducers includes a narrow-pitched electrode finger portion in which a pitch of electrode fingers in a portion of the interdigital transducer at an end of the interdigital transducer is narrower than that of electrode fingers in the remaining portions of the interdigital transducer at an area where the at least two interdigital transducers are adjacent to each other; and
   at least one surface acoustic wave resonator connected in series between the surface acoustic wave filter section and one of an input signal terminal and an output signal terminal; wherein
      the surface acoustic wave filter section is a threefold mode surface acoustic wave filter section of a longitudinally coupled resonator type, and an impedance of the surface acoustic wave filter section is capacitive in a resonance mode in the highest frequency region of three resonance modes thereof;

the resonance point of the surface acoustic wave resonator is within a passband of the surface acoustic wave filter section, and the antiresonance point of the surface acoustic wave resonator is in the vicinity of the high frequency region of the passband of the surface acoustic wave filter section; and the surface acoustic wave resonator is arranged such that the impedance in the resonance mode positioned in the highest frequency region is close to an impedance matching point.

25. A communication apparatus comprising a surface acoustic wave filter comprising:

a surface acoustic wave filter section including a piezoelectric substrate, at least two interdigital transducers arranged in a direction of propagation of a surface acoustic wave propagated on the piezoelectric substrate, and a reflector arranged in an area where the at least two interdigital transducers are adjacent to each other, the reflector having a plurality of electrode fingers having an electrode finger pitch different from an electrode finger pitch of the at least two interdigital transducers; and at least one surface acoustic wave resonator connected in series between the surface acoustic wave filter section and one of an input signal terminal and an output signal terminal; wherein the surface acoustic wave filter section is a threefold mode surface acoustic wave filter section of a longitudinally coupled resonator type, and an impedance of the surface acoustic wave filter section is capacitive in a resonance mode in the highest frequency region outside of three resonance modes;

the resonance point of the surface acoustic wave resonator is positioned within a passband of the surface acoustic wave filter section, and the antiresonance point of the surface acoustic wave resonator is positioned in the vicinity of the high frequency region of the passband of the surface acoustic wave filter section; and the at least one surface acoustic wave resonator is arranged such that the impedance in the resonance mode in the highest frequency region is close to an impedance matching point.

* * * * *